US010250230B2

(12) United States Patent
Ono

(10) Patent No.: US 10,250,230 B2
(45) Date of Patent: Apr. 2, 2019

(54) FILTER AND MULTIPLEXER

(71) Applicant: TAIYO YUDEN CO., LTD., Tokyo (JP)

(72) Inventor: Satoru Ono, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 0 days.

(21) Appl. No.: 15/581,485

(22) Filed: Apr. 28, 2017

(65) Prior Publication Data

US 2017/0331456 A1     Nov. 16, 2017

(30) Foreign Application Priority Data

May 11, 2016   (JP) ................................. 2016-095539

(51) Int. Cl.
*H03H 9/64*  (2006.01)
*H03H 9/25*  (2006.01)
*H03H 9/02*  (2006.01)

(52) U.S. Cl.
CPC .......... *H03H 9/64* (2013.01); *H03H 9/02637* (2013.01); *H03H 9/25* (2013.01)

(58) Field of Classification Search
CPC .................................. H03H 9/64; H01L 41/04
USPC ........... 333/133, 193–196; 310/313 B, 313 R
See application file for complete search history.

(56) References Cited

U.S. PATENT DOCUMENTS

| 7,154,359 | B2* | 12/2006 | Inoue | ................... | H03H 9/0538 |
| | | | | | 333/193 |
| 7,332,986 | B2* | 2/2008 | Koga | ................... | H03H 9/0576 |
| | | | | | 310/313 B |
| 7,518,470 | B2* | 4/2009 | Makibuchi | ........... | H03H 9/0038 |
| | | | | | 333/133 |
| 8,138,854 | B2* | 3/2012 | Hara | .................... | H03H 9/0028 |
| | | | | | 333/126 |
| 8,174,339 | B2* | 5/2012 | Matsuda | .............. | H03H 9/0571 |
| | | | | | 333/126 |
| 2007/0046395 | A1 | 3/2007 | Tsutsumi et al. | | |

(Continued)

FOREIGN PATENT DOCUMENTS

JP     H9-167937 A      6/1997
JP     2007-060411 A    3/2007

(Continued)

OTHER PUBLICATIONS

Japanese Office Action dated Dec. 4, 2018, in a counterpart Japanese patent application No. 2016-095539. (A machine translation (not reviewed for accuracy) attached.).

*Primary Examiner* — Dean O Takaoka
(74) *Attorney, Agent, or Firm* — Chen Yoshimura LLP

(57) ABSTRACT

A filter includes: a piezoelectric substrate; one or more series resonators that are located on the piezoelectric substrate and are connected in series between an input terminal and an output terminal; at least one series resonator that is connected between a first node and a second node, is included in the one or more series resonators, and includes a reflector that is grounded, the first node and the second node being located between the input terminal and the output terminal; and a cancel line that is connected in parallel with the at least one series resonator between the first node and the second node, and cancels a signal outside a passband propagating through the at least one series resonator from the first node to the second node.

11 Claims, 25 Drawing Sheets

(56) References Cited

U.S. PATENT DOCUMENTS

| | | | | |
|---|---|---|---|---|
| 2008/0007370 A1* | 1/2008 | Matsumoto | .......... | H03H 9/0061 |
| | | | | 333/194 |
| 2010/0194494 A1 | 8/2010 | Inoue et al. | | |
| 2013/0113576 A1 | 5/2013 | Inoue et al. | | |
| 2016/0072477 A1* | 3/2016 | Inoue | .................. | H03H 9/6433 |
| | | | | 333/133 |
| 2018/0131348 A1* | 5/2018 | Takahashi | ............ | H03H 9/6483 |

FOREIGN PATENT DOCUMENTS

| JP | 2010-178186 A | 8/2010 |
|---|---|---|
| JP | 2013-118611 A | 6/2013 |
| JP | 2014-120841 A | 6/2014 |

\* cited by examiner

FIG. 10

| | | S11a | S11b | S12 | S13a | S13b | S14 | S15a | S15b |
|---|---|---|---|---|---|---|---|---|---|
| IDT | APERTURE LENGTH [λ] | 25.3 | 15.7 | 22.0 | 24.0 | 28.5 | 17.7 | 15.0 | 15.0 |
| | NUMBER OF PAIRS | 230 | 230 | 90 | 155 | 155 | 152 | 190 | 190 |
| | λ [μm] | 2.132 | 2.117 | 2.097 | 2.099 | 2.130 | 2.132 | 2.116 | 2.116 |
| | DUTY RATIO [%] | 31.2 | 31.2 | 31.2 | 31.2 | 31.2 | 31.2 | 31.2 | 31.2 |
| REFLECTOR | NUMBER OF PAIRS | 10 | 10 | 10 | 10 | 10 | 10 | 10 | 10 |
| | λ [μm] | 2.118 | 2.101 | 2.116 | 2.081 | 2.113 | 2.147 | 2.113 | 2.113 |
| | DUTY RATIO [%] | 47.2 | 47.2 | 47.2 | 47.2 | 47.2 | 47.2 | 47.2 | 47.2 |

| | | P11 | P12 | P13 |
|---|---|---|---|---|
| IDT | APERTURE LENGTH [λ] | 29.0 | 28.0 | 33.7 |
| | NUMBER OF PAIRS | 80 | 45 | 63 |
| | λ [μm] | 2.157 | 2.164 | 2.162 |
| | DUTY RATIO [%] | 52.2 | 52.2 | 52.2 |
| REFLECTOR | NUMBER OF PAIRS | 10 | 10 | 10 |
| | λ [μm] | 2.179 | 2.178 | 2.179 |
| | DUTY RATIO [%] | 52.2 | 52.2 | 52.2 |

| | | | C3a | C3b |
|---|---|---|---|---|
| IDT | APERTURE LENGTH [λ] | | 12.4 | 12.4 |
| | NUMBER OF PAIRS | | 53.5 | 53.5 |
| | λ [μm] | | 1.799 | 1.799 |
| | DUTY RATIO [%] | | 52.2 | 52.2 |

| | | C1a | C1b | C2a | C2b | C3a | C3b | | |
|---|---|---|---|---|---|---|---|---|---|
| IDT | APERTURE LENGTH [λ] | 24.9 | 24.9 | 6.7 | 6.7 | 22 | | 15.8 | 18 |
| | NUMBER OF PAIRS | 15 | 15 | 16.5 | 16.5 | | | 3.5 | 1 |
| | λ [μm] | 1.831 | 1.831 | 1.839 | 1.839 | 1.883 | 1.759 | 1.806 | 1.942 |
| | DUTY RATIO [%] | 52.2 | 52.2 | 52.2 | 52.2 | 52.2 | 52.2 | 52.2 | 52.2 |
| REFLECTOR | NUMBER OF PAIRS | 5 | 5 | 5 | 5 | 4.5 | | 4 | |
| | λ [μm] | 1.831 | 1.831 | 1.839 | 1.839 | 1.828 | | 1.852 | |
| | DUTY RATIO [%] | 52.2 | 52.2 | 52.2 | 52.2 | 52.2 | | 52.2 | |

FILTER AND MULTIPLEXER

CROSS-REFERENCE TO RELATED APPLICATION

This application is based upon and claims the benefit of priority of the prior Japanese Patent Application No. 2016-095539, filed on May 11, 2016, the entire contents of which are incorporated herein by reference.

FIELD

A certain aspect of the present invention relates to a filter and a multiplexer.

BACKGROUND

Acoustic wave filters and multiplexers using surface acoustic wave resonators have been used for mobile communication terminals. To improve the attenuation characteristic of the acoustic wave filter and to improve the attenuation characteristic and/or isolation characteristic of the multiplexer, it has been known to use a cancel circuit as disclosed in, for example, Japanese Patent Application Publication Nos. 2013-118611 and 2014-120841.

However, with the decrease in size of the filter and the multiplexer, the cancel circuit and the filter or a part of the multiplexer are capacitively coupled. The capacitive coupling may make the degree of improvement in the attenuation characteristic of the filter or the degree of improvement in the attenuation characteristic and/or isolation characteristic of the multiplexer insufficient.

SUMMARY OF THE INVENTION

According to a first aspect of the present invention, there is provided a filter including: a piezoelectric substrate; one or more series resonators that are located on the piezoelectric substrate and are connected in series between an input terminal and an output terminal; at least one series resonator that is connected between a first node and a second node, is included in the one or more series resonators, and includes a reflector that is grounded, the first node and the second node being located between the input terminal and the output terminal; and a cancel line that is connected in parallel with the at least one series resonator between the first node and the second node, and cancels a signal outside a passband propagating through the at least one series resonator from the first node to the second node.

According to a second aspect of the present invention, there is provided a multiplexer including: the above filter.

According to a third aspect of the present invention, there is provided a multiplexer including: a first piezoelectric substrate and a second piezoelectric substrate; a first filter that is located on the first piezoelectric substrate and includes one or more first series resonators connected in series between a common terminal and a first terminal; a second filter that is located on the second piezoelectric substrate, includes one or more second series resonators connected in series between the common terminal and a second terminal, and has a passband that does not overlap with a passband of the first filter; at least one series resonator that is connected between a first node, which is located between the common terminal and the first terminal, and a second node, which is located between the common terminal and the second terminal, is included in the one or more first series resonator and the one or more second series resonator, and includes a reflector that is grounded; and a cancel line that is connected in parallel with the at least one series resonator between the first node and the second node, and cancels a signal outside the passband of one of the first filter and the second filter, the signal propagating through the at least one series resonator.

BRIEF DESCRIPTION OF THE DRAWINGS

FIG. 10 presents conditions of the transmit filter fabricated in the first embodiment;

DETAILED DESCRIPTION

Hereinafter, a description will be given of embodiments of the present invention with reference to the accompanying drawings.

First Embodiment

Figure 1:
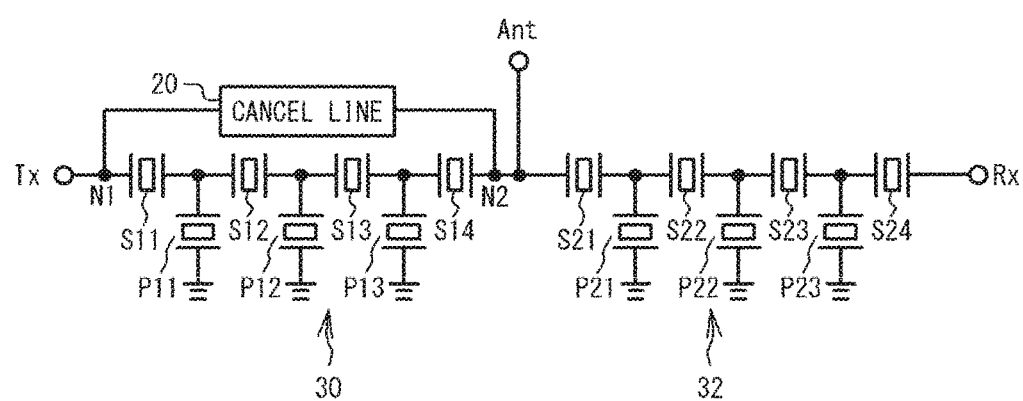
FIG. 1 is a circuit diagram of a duplexer in accordance with a first embodiment.

FIG. 1 is a circuit diagram of a duplexer in accordance with a first embodiment. As illustrated in FIG. 1, a duplexer includes a transmit filter 30 and a receive filter 32. The transmit filter 30 is connected between a common terminal Ant and a transmit terminal Tx. The receive filter 32 is connected between the common terminal Ant and a receive terminal Rx. The transmit filter 30 includes series resonators S11 through S14, parallel resonators P11 through P13, and a cancel line 20. The series resonators S11 through S14 are connected in series between the transmit terminal Tx and the common terminal Ant. The parallel resonators P11 through P13 are connected in parallel between the transmit terminal Tx and the common terminal Ant. The cancel line 20 is connected in parallel with the series resonators S11 through S14 between nodes N1 and N2.

The receive filter 32 includes series resonators S21 through S24 and parallel resonators P21 through P23. The series resonators S21 through S24 are connected in series between the common terminal Ant and the receive terminal Rx. The parallel resonators P11 through P14 are connected in parallel between the common terminal Ant and the receive terminal Rx. The transmit filter 30 transmits signals in the transmit band to the common terminal Ant among signals input to the transmit terminal Tx, and suppresses other signals. The receive filter 32 transmits signals in the receive band to the receive terminal Rx among signals input to the common terminal Ant, and suppresses other signals. That is, the passband of the transmit filter 30 and the passband of the receive filter 32 differ from each other, and do not overlap.

Figure 2:
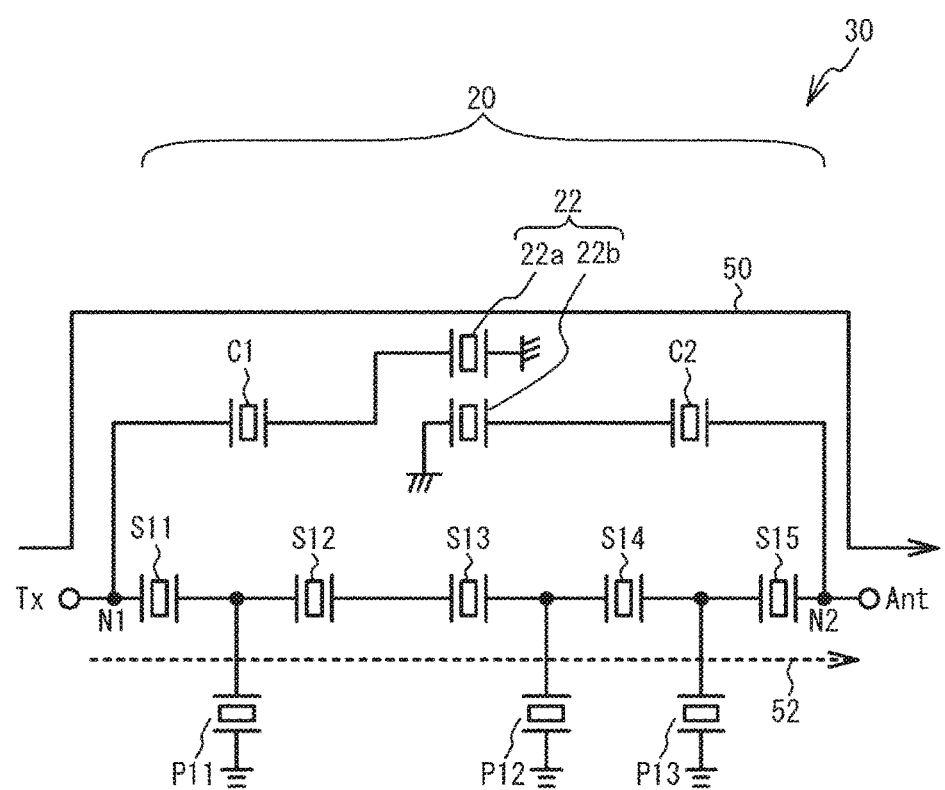
FIG. 2 is a circuit diagram of a transmit filter in the first embodiment.

FIG. 2 is a circuit diagram of the transmit filter in the first embodiment. As illustrated in FIG. 2, series resonators S11 through S15 are located. As the cancel line 20, connected in series between the nodes N1 and N2 are a capacitor C1, a longitudinally coupled resonator 22, and a capacitor C2. The capacitor C1 is connected between the node N1 and the longitudinally coupled resonator 22. The capacitor C2 is connected between the longitudinally coupled resonator 22 and the node N2. Used as the capacitors C1 and C2 are acoustic wave resonators having a resonant frequency greatly different from the passband of the transmit filter 30. The longitudinally coupled resonator 22 includes Inter Digital Transducers (IDTs) 22a and 22b. The IDT 22a is connected between the capacitor C1 and a ground. The IDT 22b is connected between a ground and the capacitor C2. The IDTs 22a and 22b are aligned in the propagation direction of the acoustic wave.

Signals in the receive band in the transmit filter 30 are suppressed by a main path 52 passing the series resonators S11 through S15 as indicated by the dotted line arrow. However, a signal in the receive band is not completely suppressed in the main path 52, and a part of the signal in the receive band leaks from the transmit terminal Tx to the common terminal Ant. Thus, as indicated by the solid line arrow, a cancel path 50 passing the cancel line 20 from the node N1 to the node N2 is provided. The cancel line 20 generates from a signal of the node N1 a signal having a phase approximately opposite to the phase of a signal of the main path 52 and having an amplitude approximately equal to the amplitude of the signal of the main path 52, and outputs it. Accordingly, the signal of the main path 52 and the signal of the cancel path 50 cancel out each other, and the leakage of signals in the receive band from the transmit terminal Tx to the common terminal Ant is reduced. Thus, the attenuation characteristic of the transmit filter 30 in the receive band can be improved, and/or the leakage of signals in the receive band from the transmit terminal Tx to the receive terminal Rx can be reduced. Therefore, the isolation characteristic of the duplexer can be improved.

The longitudinally coupled resonator 22 can adjust the amplitude and phase of the signal of the cancel path 50 by adjusting at least one of the distance between the IDTs 22a and 22b, the pitch between electrode fingers of the IDTs 22a and 22b, and the aperture length. Accordingly, a signal propagating through the main path 52 and a signal propagating through the cancel path 50 can be adjusted to have the opposite phase and the same amplitude. The capacitors C1 and C2 make the impedance between the longitudinally coupled resonator 22 and the nodes N1 and N2 high. Accordingly, the amplitude of a signal passing the cancel line 20 can be adjusted.

Figure 3A:
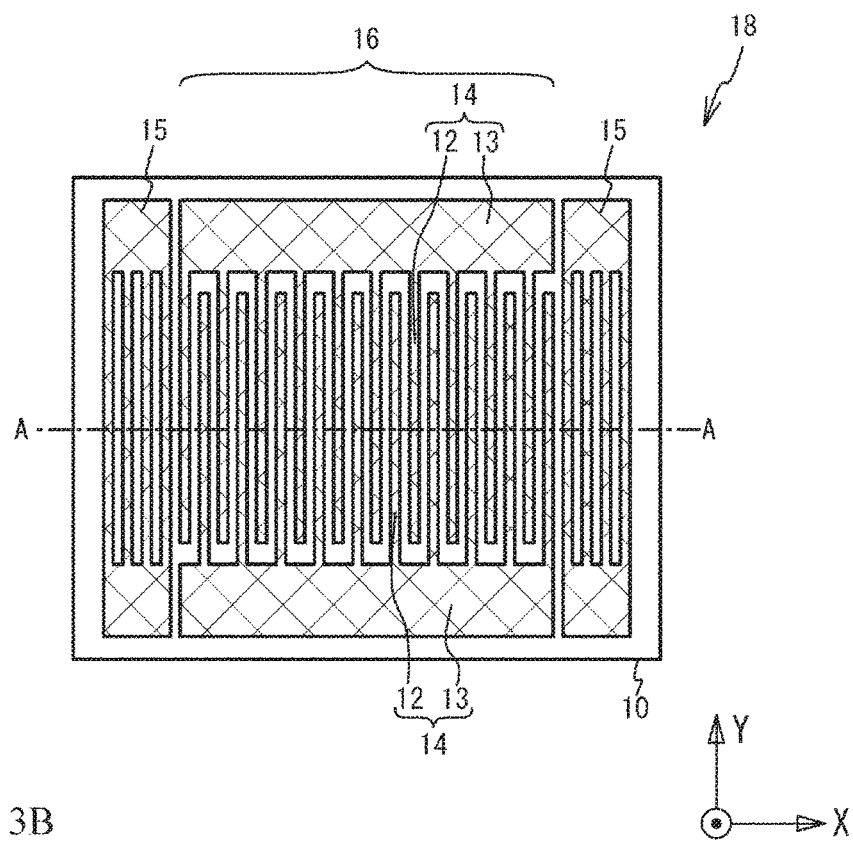
FIG. 3A is a plan view of an acoustic wave resonator in the first embodiment.
Figure 3B:
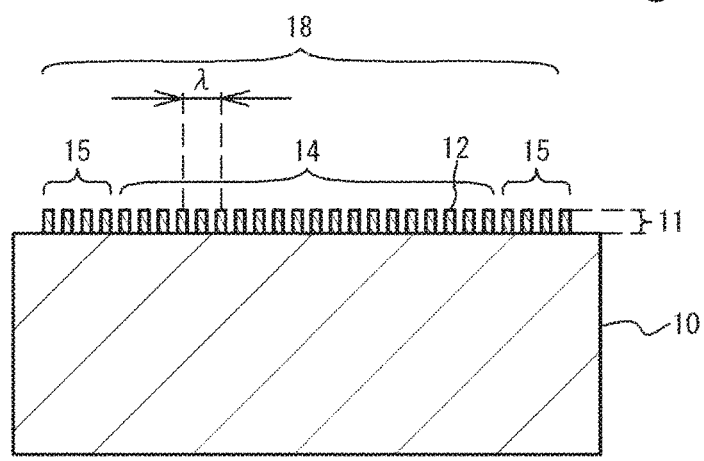
FIG. 3B is a cross-sectional view taken along line A-A in FIG. 3A.

FIG. 3A is a plan view of an acoustic wave resonator in the first embodiment, and FIG. 3B is a cross-sectional view taken along line A-A in FIG. 3A. As illustrated in FIG. 3A and FIG. 3B, an IDT 16 and reflectors 15 are formed on a piezoelectric substrate 10. The IDT 16 and the reflectors 15 are formed of a metal film 11 formed on the piezoelectric substrate 10. The IDT 16 includes a pair of comb-shaped electrodes 14 facing each other. The comb-shaped electrode 14 includes a plurality of electrode fingers 12 and a bus bar 13 to which the electrode fingers 12 are coupled. The pair of comb-shaped electrodes 14 face each other so that the electrode fingers 12 of one of the comb-shaped electrodes 14 and the electrode fingers 12 of the other are alternated with each other.

The acoustic wave excited by the electrode fingers 12 mainly propagates in the alignment direction of the electrode fingers 12. The propagated acoustic wave is reflected by the reflectors 15. The pitch of the electrode fingers 12 corresponds to approximately the wavelength $\lambda$ of the acoustic wave. The propagation direction of the acoustic wave is defined as an X direction, and a direction perpendicular to the propagation direction (i.e., the extension direction of the electrode finger 12) is defined as a Y direction. The X direction and the Y direction do not necessarily correspond to the X-axis direction and the Y-axis direction of the crystal orientation of the piezoelectric substrate 10. When the piezoelectric substrate 10 is a rotated Y-cut X-propagation lithium tantalate substrate or a lithium niobate substrate, the X direction corresponds to the X-axis direction of the crystal orientation. The metal film 11 is, for example, an aluminum film or a copper film.

The piezoelectric substrate 10 may be bonded on an insulating substrate such as a sapphire substrate, a spinel substrate, or an alumina substrate, or a semiconductor substrate such as a silicon substrate. A protective film or a temperature compensation film covering the IDT 16 and the reflectors 15 may be provided. The reflectors 15 of a one-port acoustic wave resonator are made to be floating. This is because when the reflectors 15 are grounded, the capacitive coupling between the reflectors 15 and the IDT 16 increases, deteriorating the resonance characteristic.

Figure 4:
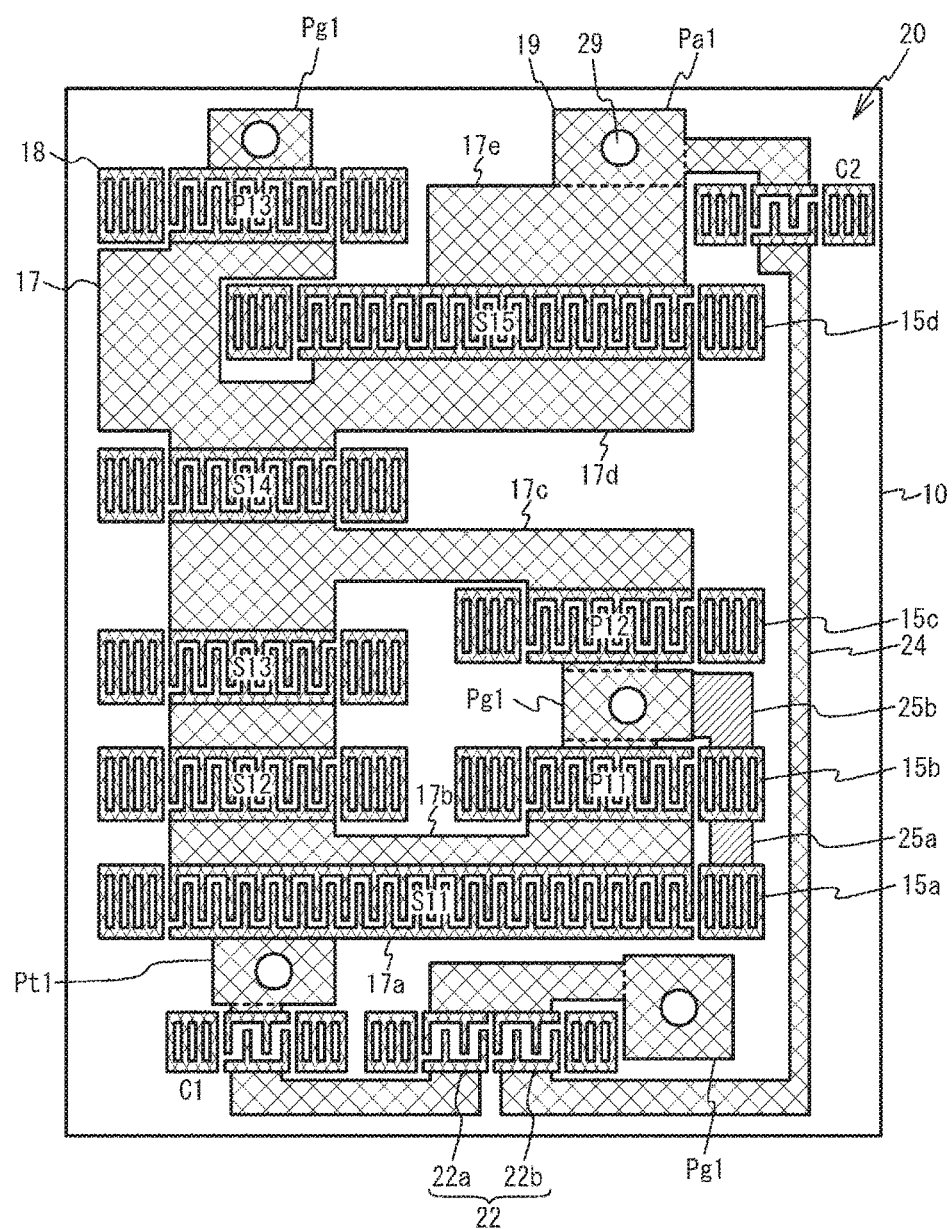
FIG. 4 is a plan view of a piezoelectric substrate on which the transmit filter is formed in the first embodiment.

FIG. 4 is a plan view of a piezoelectric substrate on which the transmit filter is formed in the first embodiment. As illustrated in FIG. 4, located on the upper surface of the piezoelectric substrate 10 are a plurality of acoustic wave resonators 18, wiring lines 17, pads 19, and the cancel line 20. The acoustic wave resonators 18 include the series resonators S11 through S15 and the parallel resonators P11 through P13. The wiring lines 17 interconnect the acoustic wave resonators 18. The pads 19 are coupled to the acoustic wave resonators 18. Bumps 29 are located on the pads 19. The pads 19 include a common pad Pa1, a transmit pad Pt1, and ground pads Pg1. The common pad Pa1 is electrically coupled to the common terminal Ant. The transmit pad Pt1 is electrically coupled to the transmit terminal Tx. The ground pad Pg1 is electrically coupled to a ground.

The transmit pad Pt1 is coupled to the series resonator S11 by a wiring line 17a (in FIG. 4, mainly a bus bar). The series resonator S11 is coupled to the series resonator S12 and the parallel resonator P11 by a wiring line 17b. The series resonator S13 is coupled to the parallel resonator P12 and the series resonator S14 by a wiring line 17c. The series resonator S14 is coupled to the series resonator S15 and the parallel resonator P13 by a wiring line 17d. The series resonator S15 is coupled to the common pad Pa1 by a wiring line 17e.

As the capacitors C1 and C2, provided are acoustic wave resonators. When an acoustic wave resonator is used as a capacitor, a reflector may not be necessarily provided, but in FIG. 4, to reduce the leakage of the acoustic wave, reflectors are provided. As the longitudinally coupled resonator 22, provided are the IDTs 22a and 22b. A wiring line 24 is connected between the longitudinally coupled resonator 22 and the capacitor C2. A reflector 15a, which is located closer to the wiring line 24, of the series resonator S11 and a reflector 15b, which is located closer to the wiring line 24, of the parallel resonator P11 are coupled to the ground pad Pg1 through wiring lines 25a and 25b. The reflectors, which are located at the sides opposite from the wiring line 24, of the series resonator S11 and the parallel resonator P11 are floating, and are not coupled to a ground. The reflectors of the acoustic wave resonators 18 other than the series resonator S11 and the parallel resonator P11 are floating, and are not coupled to a ground.

Figure 5:
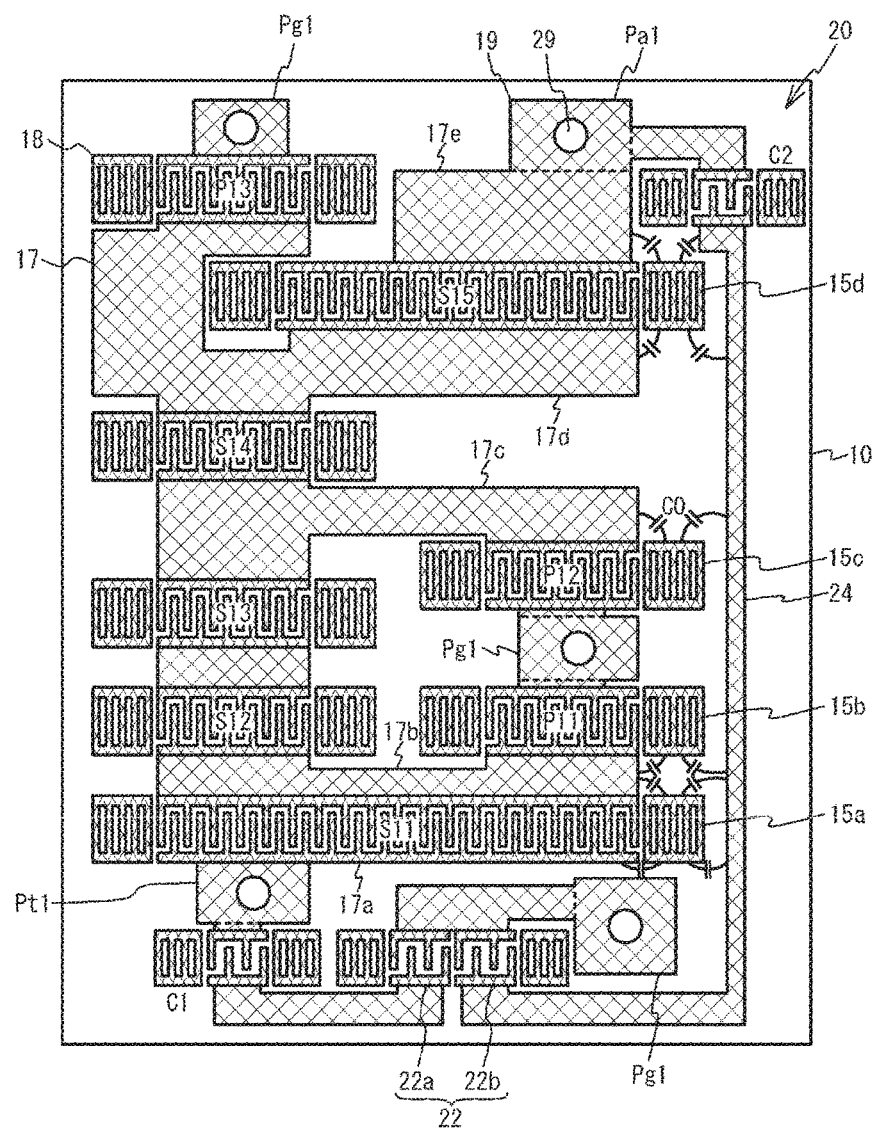
FIG. 5 is a plan view of a piezoelectric substrate on which a transmit filter is formed in a first comparative example.

To describe the advantage of the first embodiment, a first comparative example will be described. FIG. 5 is a plan view of a piezoelectric substrate on which a transmit filter is formed in the first comparative example. As illustrated in FIG. 5, in the first comparative example, the reflectors 15a and 15b, which are located closer to the wiring line 24, of the series resonator S11 and the parallel resonator P11 are floating, and are not coupled to a ground. Other structures are the same as those of the first embodiment, and the description thereof is thus omitted. In the first comparative example, a parasitic capacitance C0 is formed between the wiring line 17a and the wiring line 24 through the reflector 15a. The parasitic capacitance C0 is formed between the wiring line 17b and the wiring line 24 through the reflector 15a and through the reflector 15b. The parasitic capacitance C0 is formed between the wiring line 17c and the wiring line 24 through a reflector 15c of the parallel resonator P12. The parasitic capacitance C0 is formed between the wiring line 17d and the wiring line 24 through a reflector 15d of the series resonator S15. The parasitic capacitance C0 is formed between the wiring line 17e and the wiring line 24 through the reflector 15d of the series resonator S15.

Figure 6:
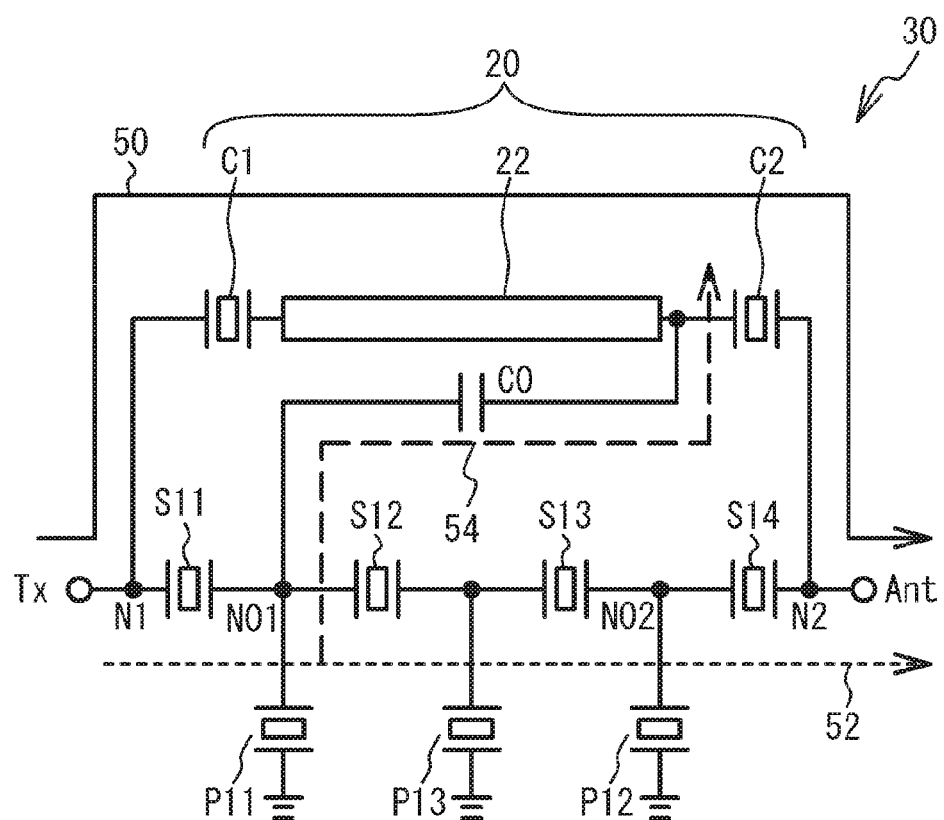
FIG. 6 is a diagram for describing signal leakage in the first comparative example.

FIG. 6 is a diagram for describing signal leakage in the first comparative example. As illustrated in FIG. 6, signals in the receive band mainly propagate from the transmit terminal Tx to the common terminal Ant through the main path 52 of the series resonators S11 through S14. As passing series resonators, a signal in the receive band is suppressed. When the distance between the series resonators S11 through S14 and the cancel line 20 is short, the parasitic capacitance C0 is formed between the main path 52 and the cancel path 50. The parasitic capacitance C0 causes the main path 52 and the cancel path 50 to be capacitively coupled. Accordingly, as indicated by the dashed line arrow, a part of a signal of the main path 52 leaks to the cancel path 50 through a leakage path 54 formed by the parasitic capacitance C0. Thus, the signal leaked by the leakage path 54 changes the signal of the cancel path 50, and thereby, the signal of the main path 52 is not sufficiently canceled. Accordingly, the degree of improvement in attenuation characteristic of the transmit filter 30 and/or the degree of improvement in attenuation characteristic and/or isolation characteristic of the duplexer by the cancel line 20 becomes insufficient. Signals that are not suppressed much in the main path 52 leak especially to the leakage path 54 through the parasitic capacitance C0 that is located close to the transmit terminal Tx.

In the first embodiment, as illustrated in FIG. 4, the reflector 15b located between the IDT of the series resonator S11 and the wiring line 24 is grounded. This configuration inhibits capacitive coupling between the series resonator S11 included in the main path 52 and the wiring line 24 included in the cancel path 50. In addition, although signals flowing through the parallel resonator P11 are small, the parallel resonator P11 is also included in the main path 52. Thus, capacitive coupling between the main path 52 and the cancel path 50 is further inhibited by grounding the reflector 15a located between the IDT of the parallel resonator P11 and the wiring line 24. Especially the reflectors of the series resonator S11 and the parallel resonator P11, which are located close to the transmit terminal Tx, are grounded. This configuration can inhibit the signal that has not been suppressed much from leaking to the cancel path 50, and improve the attenuation characteristic of the transmit filter 30, and/or improve the attenuation characteristic and/or isolation characteristic of the duplexer.

Figure 7:
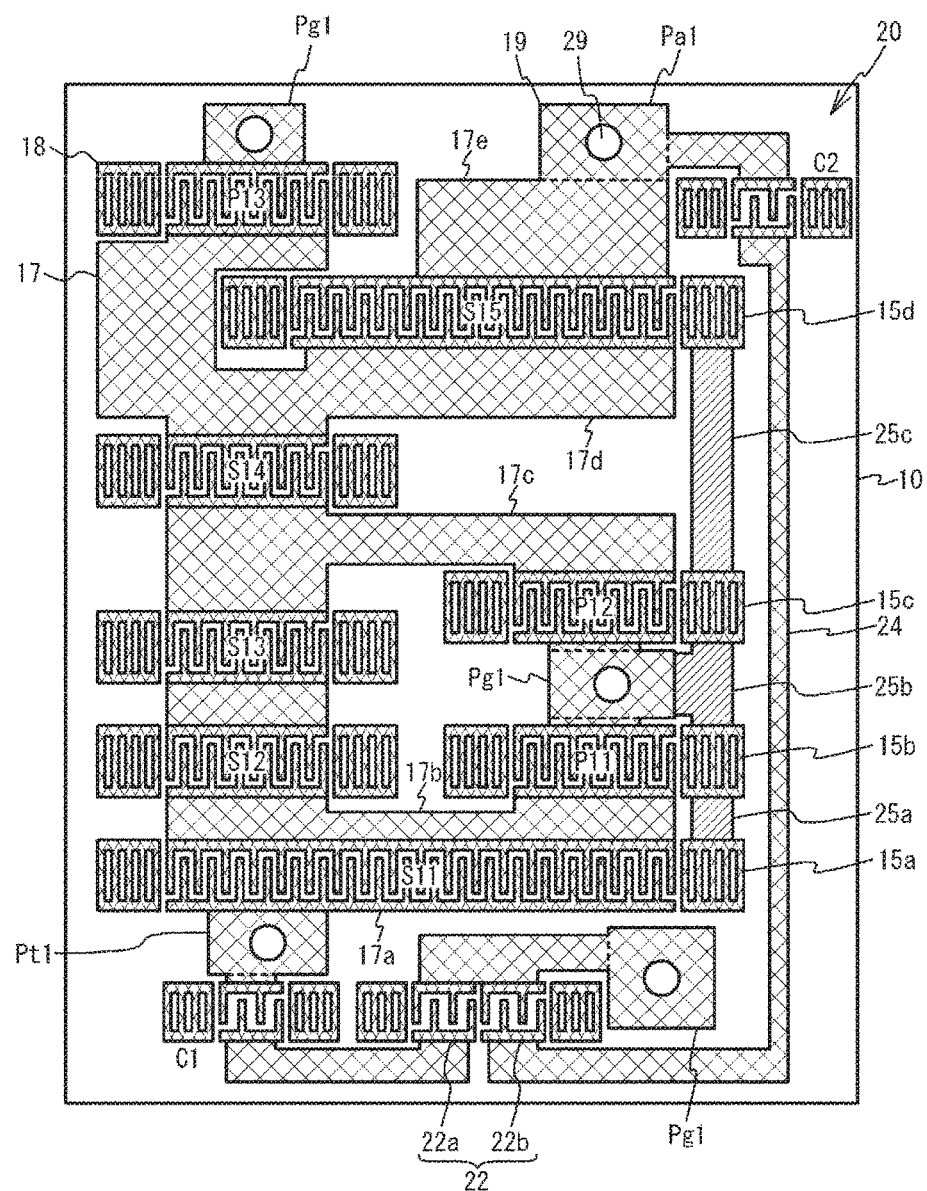
FIG. 7 is a plan view of a piezoelectric substrate on which a transmit filter is formed in a first variation of the first embodiment.

FIG. 7 is a plan view of a piezoelectric substrate on which a transmit filter is formed in a first variation of the first embodiment. As illustrated in FIG. 7, FIG. 7 differs from FIG. 4 in that the reflector 15c, which is located closer to the wiring line 24, of the parallel resonator P12 and the reflector 15d, which is located closer to the wiring line 24, of the series resonator S15 are grounded by wiring lines 25b and 25c. Other structures are the same as those illustrated in FIG. 4 of the first embodiment, and thus the description thereof is thus omitted. As in the first variation of the first embodiment, all the reflectors adjacent to the cancel line 20 may be grounded. This configuration can reduce the parasitic capacitance between the wiring lines 17a through 17e and the wiring line 24 in FIG. 5.

Figure 8:
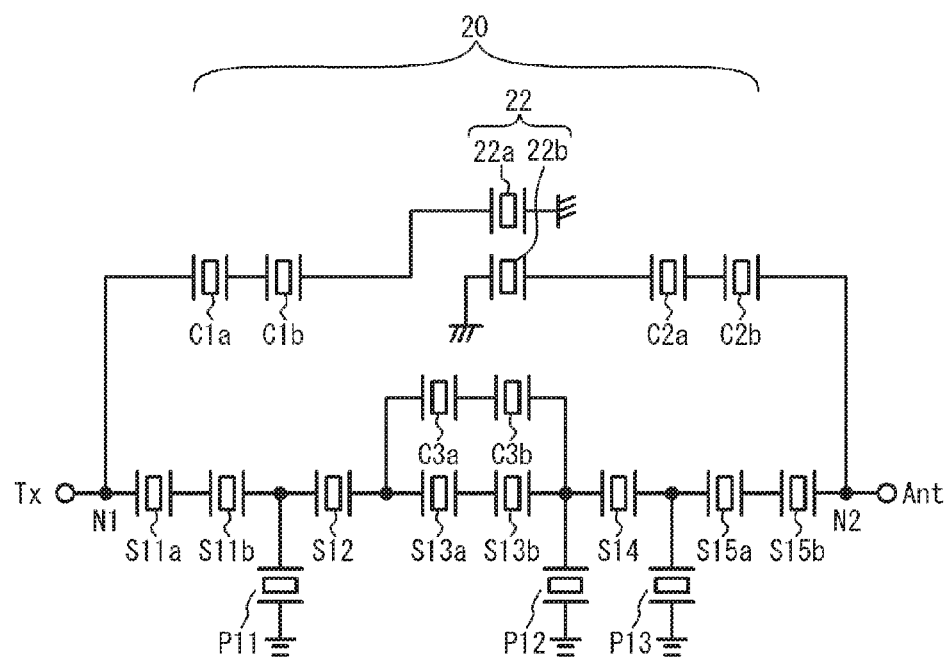
FIG. 8 is a circuit diagram of a transmit filter fabricated in the first embodiment.
Figure 9:
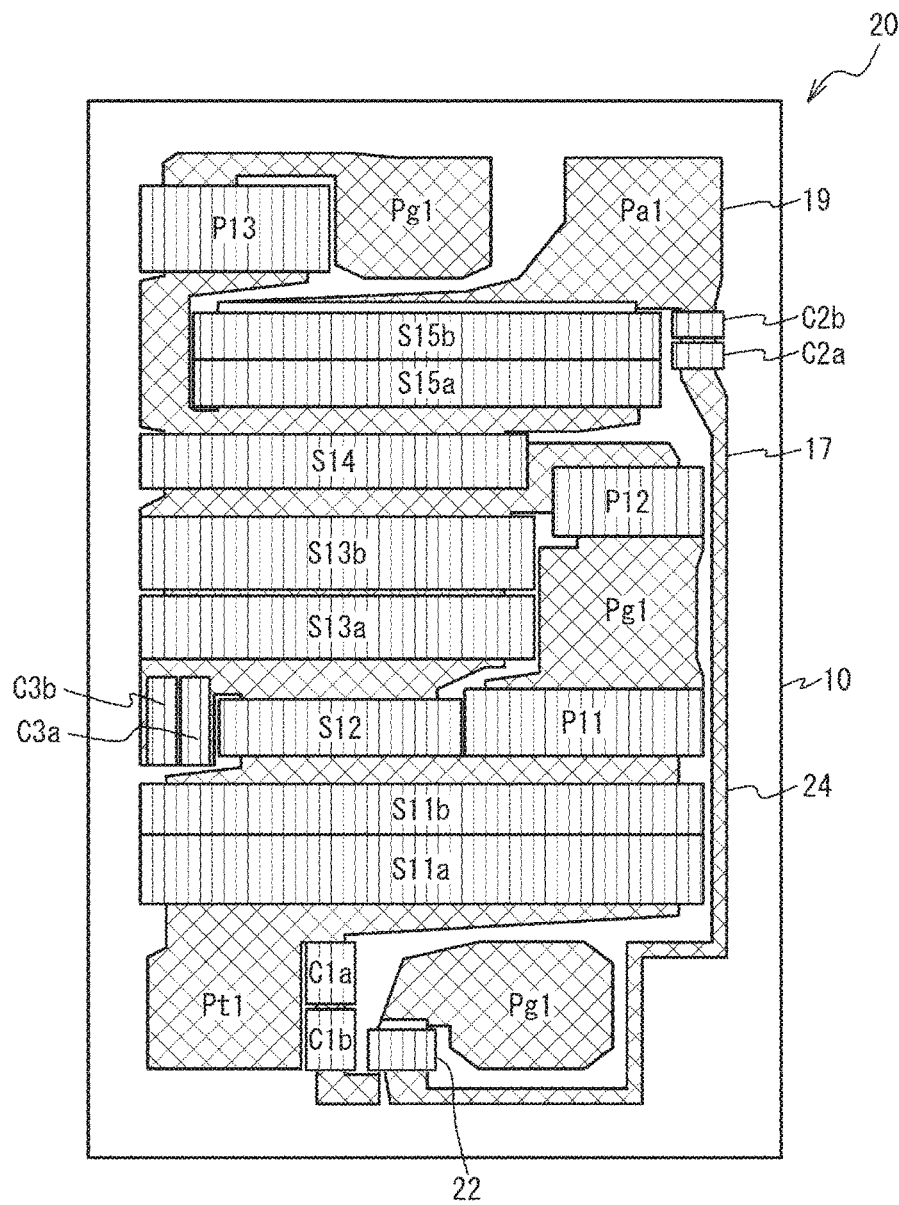
FIG. 9 is a plan view of a piezoelectric substrate on which the transmit filter fabricated in the first embodiment is formed.

For the first comparative example and the first embodiment, a duplexer including a transmit filter was fabricated to measure the attenuation characteristic of the transmit filter and the isolation characteristic of the duplexer. FIG. 8 is a circuit diagram of a transmit filter fabricated in the first embodiment. FIG. 9 is a plan view of a piezoelectric substrate on which the transmit filter fabricated in the first embodiment is formed. As illustrated in FIG. 8 and FIG. 9, the series resonators S11, S13, and S15 are serially divided into S11a and S11b, S13a and S13b, and S15a and S15b, respectively. The capacitors C1 and C2 are serially divided into C1a and C1b, and C2a and C2b, respectively. The serially divided C3a and C3b are connected in parallel with the S13a and S13b between a node located between the series resonators S12 and S13a and a node located between the series resonators S13b and S14. Other structures are the same as those illustrated in FIG. 2, FIG. 4, and FIG. 5, and the description thereof is thus omitted.

The conditions of the fabricated transmit filter will be described. The piezoelectric substrate 10 was a 42° rotated Y-cut X-propagation lithium tantalate substrate with a film thickness of 250 µm. FIG. 10 presents the conditions of the transmit filter fabricated in the first embodiment. In FIG. 10, the aperture length is presented in a unit of the wavelength λ. The wavelength λ corresponds to the pitch of the electrode fingers 12 in the comb-shaped electrode 14 as illustrated in FIG. 3B. The pitch between the electrode finger 12 of one of the comb-shaped electrodes 14 and the adjacent electrode finger 12 of the other of the comb-shaped electrodes 14 corresponds to ½ of the wavelength λ. The duty ratio is calculated by (the width of the electrode finger 12)/(the pitch)×100%.

The propagation direction of the acoustic wave in the capacitors C3a and C3b is a direction perpendicular to the propagation direction of the acoustic wave in other resonators. In the longitudinally coupled resonator 22, a region where the number of pairs is two and the wavelength λ is 1.883 µm and a region where the number of pairs is one and the wavelength λ is 1.759 µm are located in the IDT 22a. A region where the number of pairs is 3.5 and the wavelength λ is 1.806 µm and a region where the number of pairs is 18 and the wavelength λ is 1.942 µm are located in the IDT 22b. In the longitudinally coupled resonator 22, a reflector of which the number of pairs is 4.5, the IDT 22a that includes the region where the number of pairs is two and the region where the number of pairs is one, the IDT 22b that includes the region where the number of pairs is 3.5 and the region where the number of pairs is 18, and a reflector of which the number of pairs is four are aligned in this order.

In the first comparative example, all the reflectors of the series resonator S11a through S15b are floating as in FIG. 5. In the first embodiment, as in FIG. 4, the reflectors, which are located closer to the wiring line 24, of the series resonators S11a and S11b and the parallel resonator P11 are coupled to a ground. Other reflectors are floating.

Figure 11A:
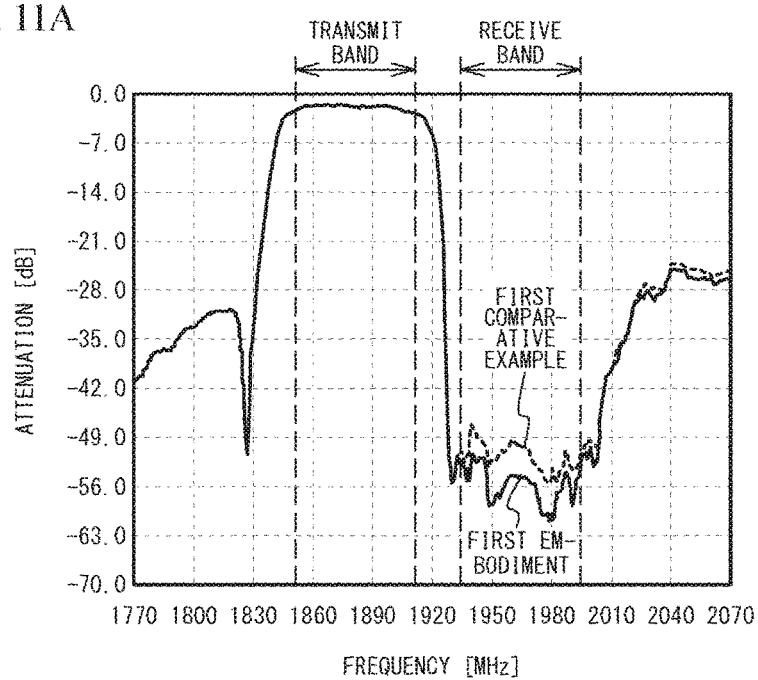
FIG. 11A illustrates the attenuation characteristics of the transmit filters in accordance with the first embodiment and the first comparative example.
Figure 11B:
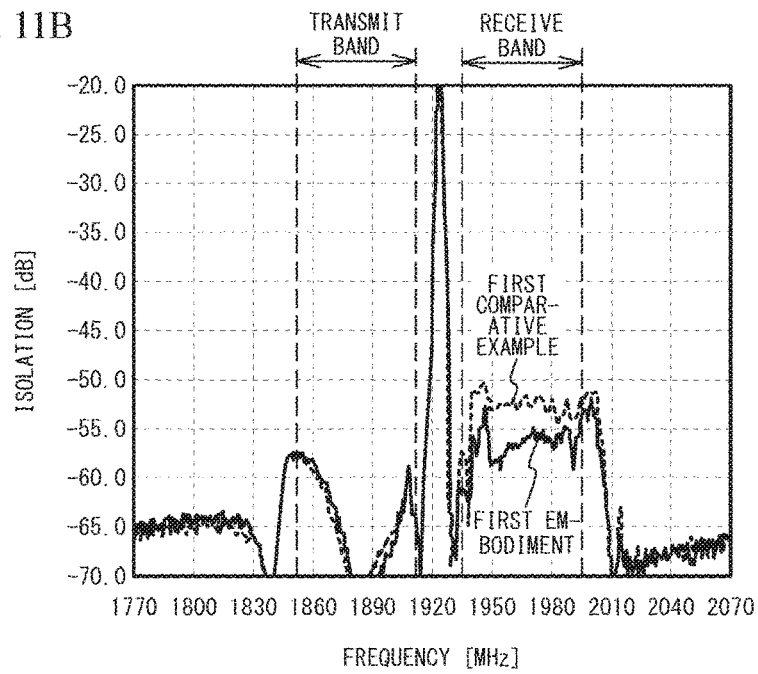
FIG. 11B illustrates the isolation characteristics of the transmit filters in accordance with the first embodiment and the first comparative example.

FIG. 11A illustrates the attenuation characteristics of the transmit filters in accordance with the first embodiment and the first comparative example, and FIG. 11B illustrates the isolation characteristics of the duplexers in accordance with the first embodiment and the first comparative example. FIG. 11A illustrates the attenuation characteristic from the transmit terminal Tx to the common terminal Ant, and FIG. 11B illustrates the isolation characteristic from the transmit terminal Tx to the receive terminal Rx. As illustrated in FIG. 11A, the attenuation characteristic in the receive band in the first embodiment improves compared to that in the first comparative example. As illustrated in FIG. 11B, the isolation characteristic in the receive band in the first embodiment improves compared to that in the first comparative example.

Figure 12:
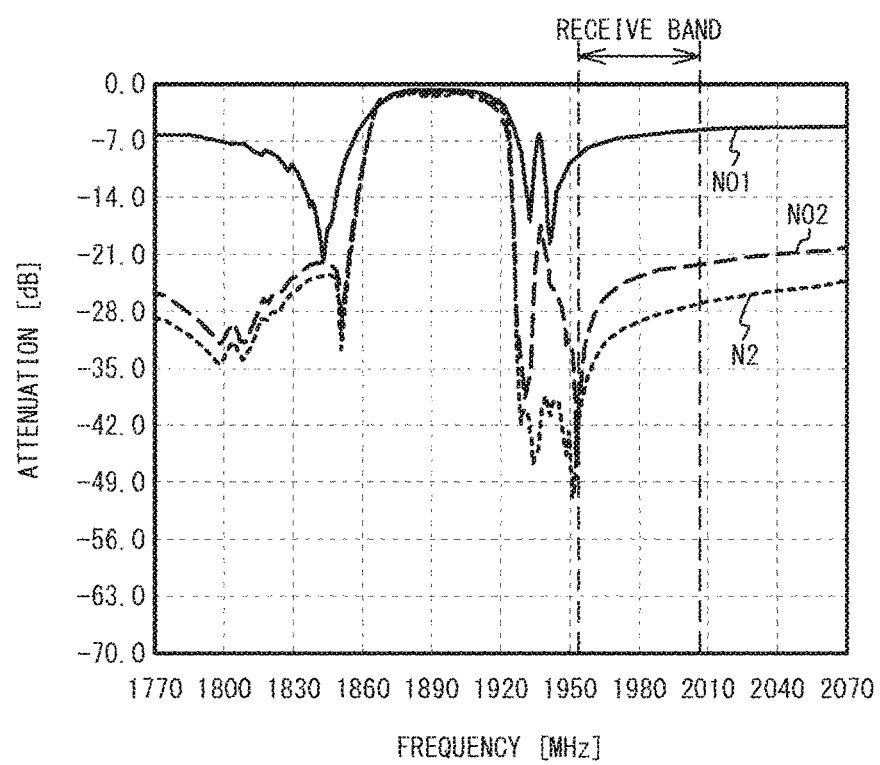
FIG. 12 illustrates attenuation in a main path.

The attenuation in the main path 52 was simulated. FIG. 12 illustrates the attenuation in the main path. Presented are the attenuation characteristics of a node NO1 between the series resonators S11 and S12, a node N02 between the series resonators S13 and S14, and the node N2 in FIG. 6. As illustrated in FIG. 12, the attenuation characteristic at the node N2 corresponds to the attenuation characteristic of the transmit filter. The attenuation characteristic at the node N02 is worse than the attenuation characteristic at the node N2, and the attenuation characteristic at the node N01 is worse than the attenuation characteristic at the node N02. As described above, the attenuation characteristic of a signal in the receive band at the location near the transmit terminal Tx is insufficient.

In the first embodiment, one or more series resonators S11 through S15 are connected in series between the transmit terminal Tx (an input terminal) and the common terminal Ant (an output terminal). The nodes N1 and N2 are located between the transmit terminal Tx and the common terminal Ant. In at least one series resonator S11 of the series resonators S11 through S15 connected between the nodes N1 and N2, the reflector is grounded. The cancel line 20 is connected in parallel with the series resonators S11 through S15 between the nodes N1 and N2, and cancels a signal in the receive band (the band other than the passband of the transmit filter 30) propagating through the series resonators S11 through S15 from the node N1 to the node N2.

Since the reflector 15a is grounded as illustrated in FIG. 4, the parasitic capacitance between the wiring lines 17a and 24 and the parasitic capacitance between the wiring lines 17b and 24 in FIG. 5 can be reduced. Thus, the leakage of signals in the receive band of the main path 52 from the wiring lines 17a and 17b to the wiring line 24 can be reduced. Therefore, as illustrated in FIG. 11A, the attenuation characteristic of the transmit filter 30 can be improved. In addition, as illustrated in FIG. 11B, the isolation characteristic of the duplexer can be improved.

The signal of the cancel path 50 and the signal of the main path 52 can cancel out each other by having the cancel line 20 generating a signal having an opposite phase to that of the signal of the main path 52 and having the same amplitude as that of the signal of the main path 52. Here, the opposite phase means the phase of which the phase difference is, for example, greater than 90° and less than 270°, and the phase difference is preferably 135° or greater and 225° or less. For example, the ratio of the amplitude is preferably 0.5 time or greater and 2 times or less.

In addition, as illustrated in FIG. 4, the series resonator S11 includes a pair of reflectors, and one reflector 15a, which is located closer to the wiring line 24 of the cancel line 20, of the pair of reflectors is grounded, and the other reflector is not grounded. When the reflector 15 is grounded, a parasitic capacitance is formed between the main path 52 and a ground through the reflector 15. The formation of parasitic capacitance deteriorates the filter characteristics. Thus, the parasitic capacitance C0 can be reduced and the deterioration of the filter characteristics can be reduced by grounding the reflector 15a, which is to be the leakage path 54, and not grounding the other reflector.

Furthermore, as illustrated in FIG. 4, at least a part of the cancel line 20 is located on the piezoelectric substrate 10. In the series resonator S11, a reflector, which is located closer to the cancel line 20 in the piezoelectric substrate 10, of a pair of reflectors is grounded, and the other reflector is not grounded. This configuration can reduce the parasitic capacitance C0 through the piezoelectric substrate 10 of which the relative permittivity is large.

As illustrated in FIG. 4, no resonator and no wiring line are located between the reflector 15a and the cancel line 20. In this case, a parasitic capacitance is easily formed between the main path 52 and the leakage path 54. Thus, the parasitic capacitance C0 can be reduced by grounding the reflector 15a.

Furthermore, grounded is the reflector of the series resonator S11 located closest to the transmit terminal Tx among at least two series resonators S11 through S15 connected between the node N1 and the node N2 as illustrated in FIG. 4. As illustrated in FIG. 12, signals in the receive band in the series resonator S11 closer to the transmit terminal Tx are hardly suppressed. The leakage of a large signal through the leakage path 54 can be reduced by grounding the reflector 15a.

As illustrated in FIG. 4, the reflectors 15 of at least one of the series resonators S12 through S15 other than the series resonator S11, which is located closest to the transmit terminal Tx among at least two series resonators S11 through S15, is not grounded. This configuration can reduce the parasitic capacitance C0, and reduce the deterioration of the filter characteristics.

As illustrated in FIG. 4, grounded is the reflector 15b of at least one parallel resonator P11 of the parallel resonators P11 through P13 connected between the node N1 and the node N2. This configuration can reduce the parasitic capacitance C0 between the wiring line 17b and the wiring line 24. As in the series resonator S11, the reflector, which is located closer to the wiring line 24, of the parallel resonator P11 is preferably grounded, and the other reflector is preferably not grounded. The reflector of the parallel resonator P11 located closest to the transmit terminal Tx among the parallel resonators P11 through P13 is preferably grounded.

Figure 13A:
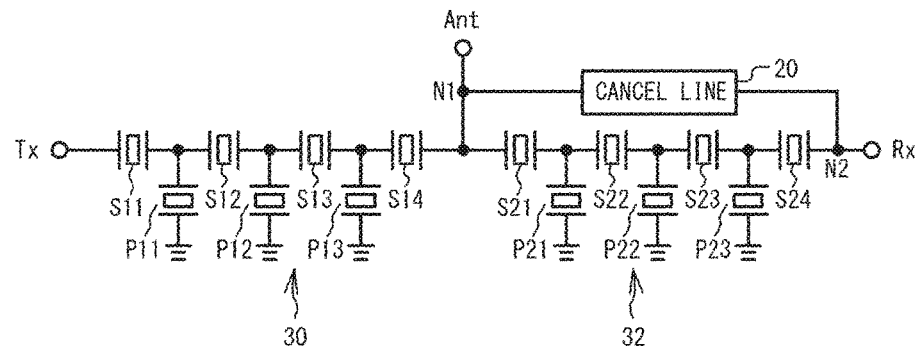
FIG. 13A through FIG. 13C are circuit diagrams (No. 1) of duplexers in accordance with a second variation of the first embodiment.

FIG. 13A through FIG. 14B are circuit diagrams of duplexers in accordance with a second variation of the first embodiment. As illustrated in FIG. 13A, the cancel line 20 is connected between the node N1, which is located closer to the common terminal Ant (an input terminal) than the series resonator S21, and the node N2, which is located closer to the receive terminal (an output terminal) Rx than the series resonator S24. This configuration causes the cancel line 20 to generate a cancel signal that cancels signals in the transmit band passing through the main path. Thus, the attenuation characteristic in the transmit band of the receive filter 32 can be improved.

Figure 13B:
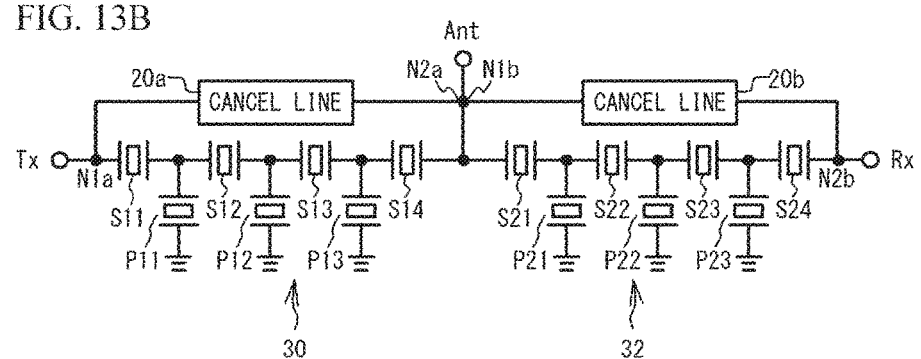

As illustrated in FIG. 13B, a cancel line 20a is connected between a node N1a, which is located closer to the transmit terminal Tx (an input terminal) than the series resonator S11, and a node N2a, which is located closer to the common terminal Ant (an output terminal) than the series resonator S14. In addition, a cancel line 20b is connected between a node N1b, which is located closer to the common terminal Ant (an input terminal) than the series resonator S21, and a node N2b, which is located closer to the receive terminal (an output terminal) Rx than the series resonator S24. The provision of the cancel line 20a can improve the attenuation characteristic in the receive band of the transmit filter 30. The provision of the cancel line 20b can improve the attenuation characteristic in the transmit band of the receive filter 32.

Figure 13C:
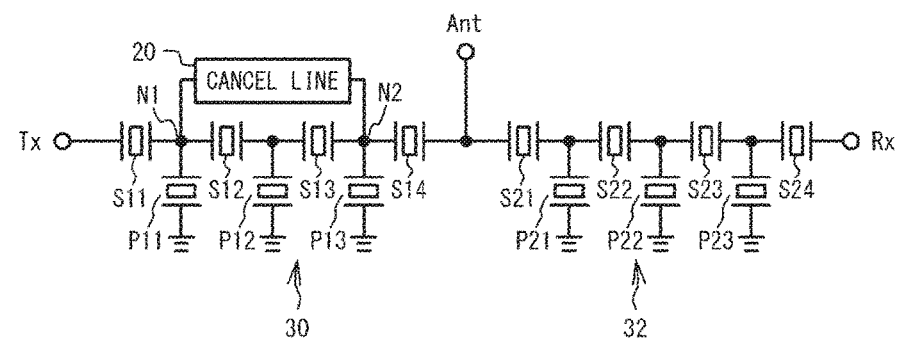
Figure 14A:
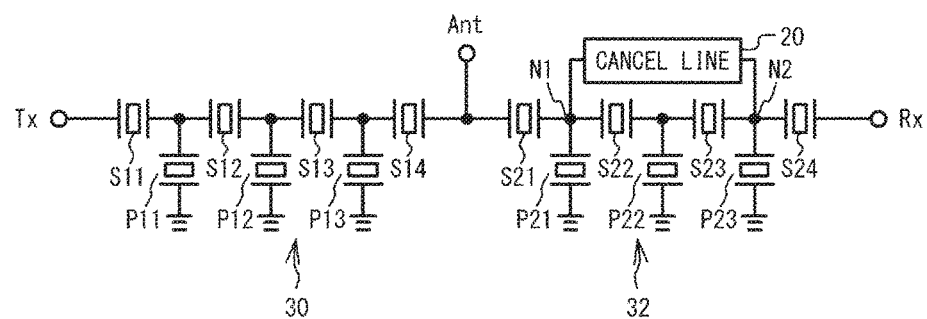
FIG. 14A and FIG. 14B are circuit diagrams (No. 2) of duplexers in accordance with the second variation of the first embodiment.

As illustrated in FIG. 13C, in the transmit filter 30, the cancel line 20 is connected between the node N1, which is located between the series resonators S11 and S12, and the node N2, which is located between the series resonators S13 and S14. As illustrated in FIG. 14A, in the receive filter 32, the cancel line 20 is connected between the node N1, which is located between the series resonators S21 and S22, and the node N2, which is located between the series resonators S23 and S24. As described above, at least one of the nodes N1 and N2 may be located between series resonators. When one or some resonators (for example, S12 and S13) affect the attenuation characteristic of the filter and/or the isolation characteristic of the duplexer, the cancel line 20 may be located in parallel with the one or some resonators. This configuration can shorten the cancel line 20, and efficiently improve the attenuation characteristic and the isolation characteristic.

In addition, the reflector of at least one series resonator of the series resonators S12 and S13 (or S22 and 23) and the parallel resonators P11 through P13 (or P21 through P23) connected between the nodes N1 and N2 is grounded. The reflectors of the series resonators S11 and S14 (or S21 and S24), which are not located between the nodes N1 and N2, are not grounded. This configuration allows the reflector effective for the inhibition of formation of the leakage path 54 to be grounded, and does not ground the reflector having less relation to the leakage path 54. Thus, the attenuation characteristic and the isolation characteristic can be improved, and the deterioration of the filter characteristic can be reduced.

Figure 14B:
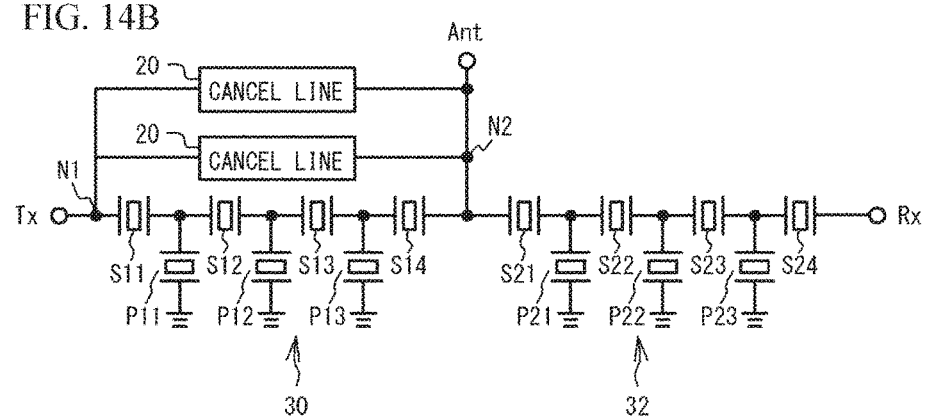

As illustrated in FIG. 14B, two cancel lines 20 are connected between the transmit terminal Tx and the common terminal Ant. The two cancel lines 20 cancel signals in different frequency bands. Accordingly, the attenuation of two different bands can be improved.

Figure 15A:
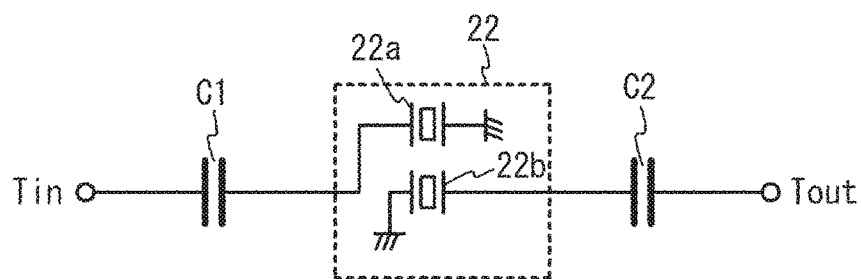
FIG. 15A through FIG. 15C are diagrams (No. 1) illustrating examples of a cancel line in the first embodiment.
Figure 15B:
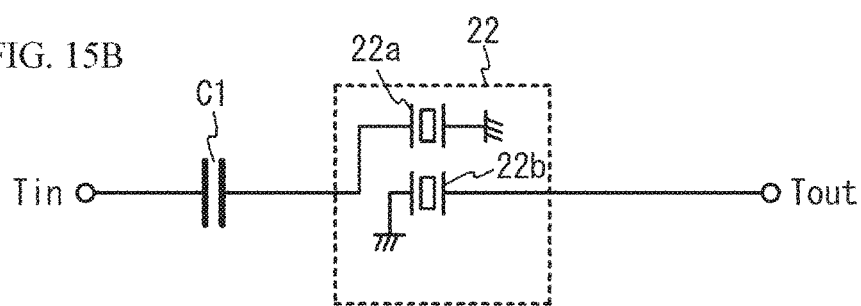
Figure 15C:
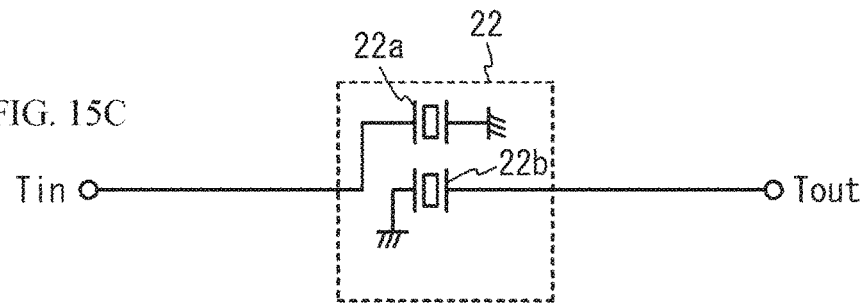

FIG. 15A through FIG. 16C illustrate examples of the cancel line in the first embodiment. As illustrated in FIG. 15A, the capacitors C1 and C2 may not be necessarily acoustic wave resonators, and may be, for example, Metal Insulator Metal (MIM) capacitors. As illustrated in FIG. 15B, one of the capacitors C1 and C2 may be omitted. As illustrated in FIG. 15C, both the capacitors C1 and C2 can be omitted.

Figure 16A:
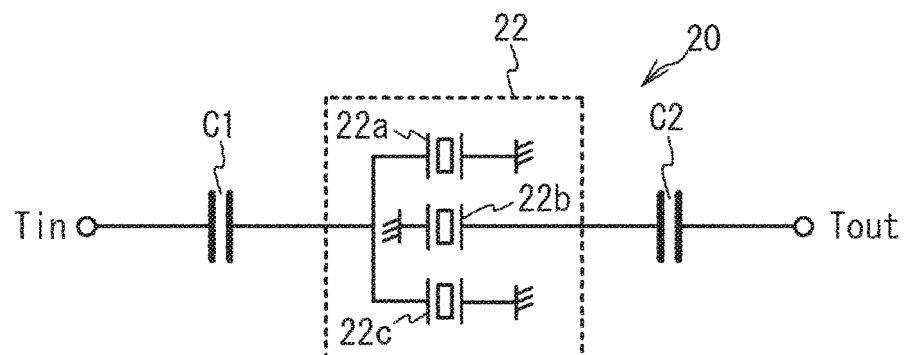
FIG. 16A through FIG. 16C are diagrams (No. 2) illustrating examples of the cancel line in the first embodiment.
Figure 16B:
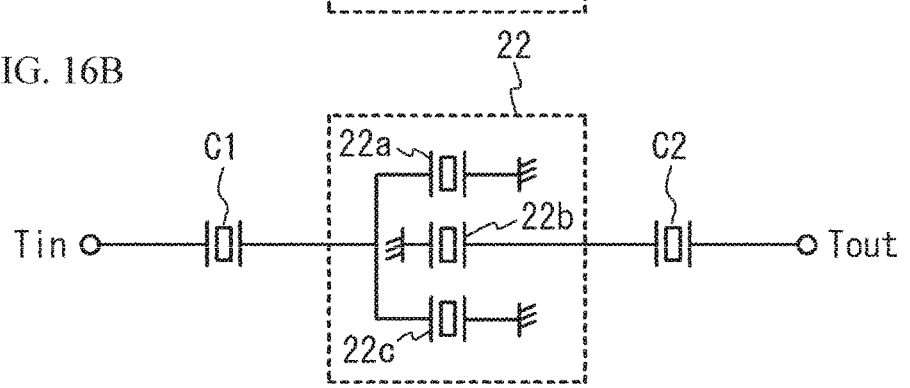
Figure 16C:
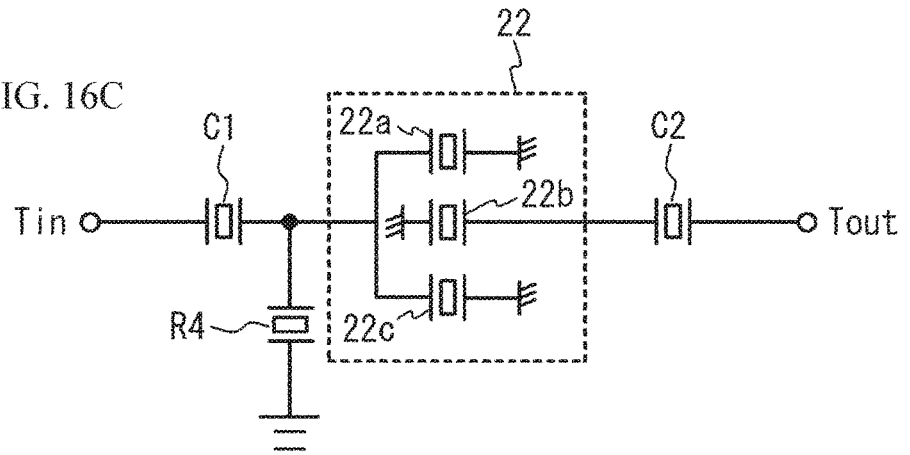

As illustrated in FIG. 16A, the longitudinally coupled resonator 22 may be composed of three IDTs 22a through 22c aligned in the propagation direction of the acoustic wave. As illustrated in FIG. 16B, the capacitors C1 and C2 may be acoustic wave resonators. As illustrated in FIG. 16C, another resonator R4 can be connected between the cancel line 20 and a ground.

Figure 17A:
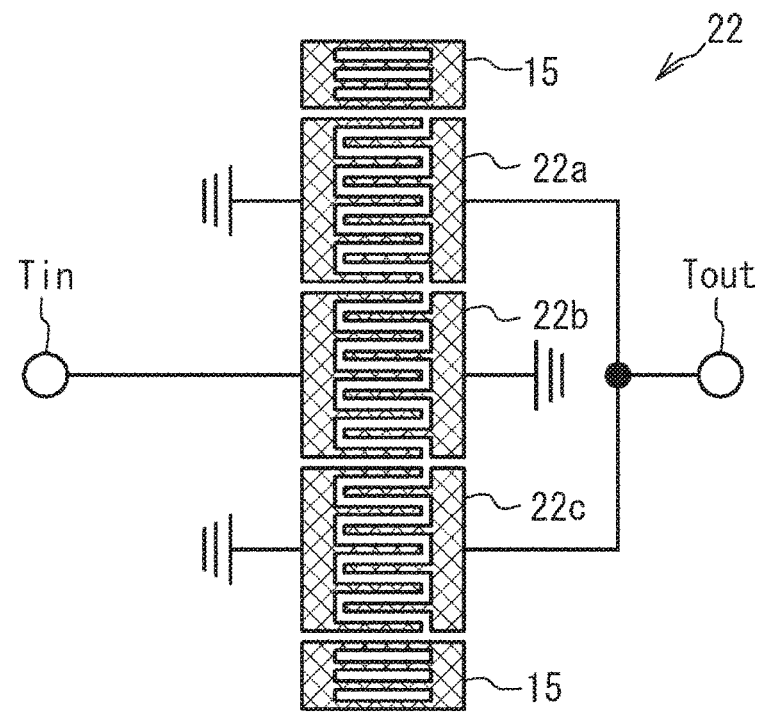
FIG. 17A and FIG. 17B are plan views illustrating examples of a longitudinally coupled resonator and a delay line in the first embodiment, respectively.
Figure 17B:
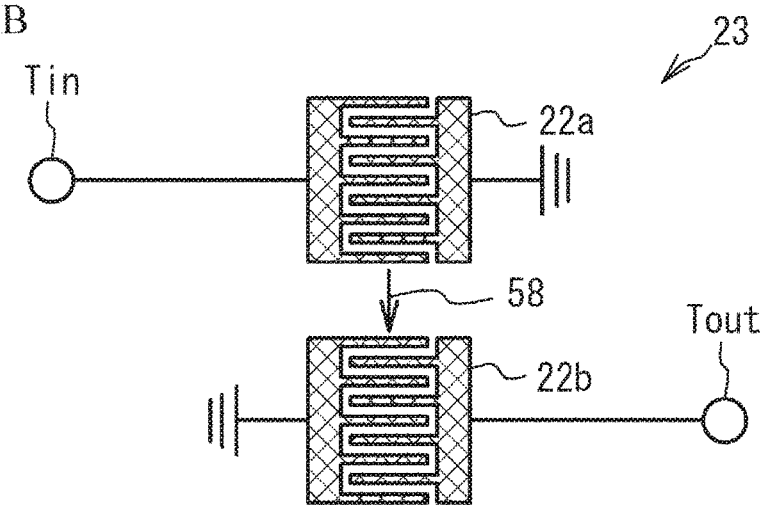

FIG. 17A and FIG. 17B are plan views illustrating examples of the longitudinally coupled resonator and the delay line in the first embodiment, respectively. As illustrated in FIG. 17A, the IDTs 22a through 22c are aligned in the propagation direction of the acoustic wave. The reflectors 15 are located at the both sides of the IDTs 22a through 22c. A first end of the IDT 22b is coupled to the input terminal Tin, and first ends of the IDTs 22a and 22b are commonly coupled to the output terminal Tout. Second ends of the IDTs 22a through 22c are grounded.

As illustrated in FIG. 17B, an acoustic wave delay line 23 includes at least two IDTs 22a and 22b. One of the comb-shaped electrodes of the IDT 22a is coupled to the input terminal Tin, and the other of the comb-shaped electrodes is coupled to a ground. One of the comb-shaped electrodes of the IDT 22b is coupled to the output terminal Tout, and the other of the comb-shaped electrodes is grounded. The IDT 22a and the IDT 22b are aligned in the propagation direction of the acoustic wave. No reflector is located, and thus the IDTs 22a and 22b are not in the resonant condition. An electrical signal input from the input terminal Tin is converted into an acoustic wave by the IDT 22a. An acoustic wave 58 propagates through the piezoelectric substrate 10, reaching the IDT 22b. The IDT 22b converts the acoustic wave 58 into an electrical signal. In the acoustic wave delay line 23, the phase and amplitude of the signal passing through the cancel line 20 can be adjusted by appropriately setting the distance between the IDT 22a and the IDT 22b, the pitch between electrode fingers, and the aperture length. Thus, instead of the longitudinally coupled resonator 22, the acoustic wave delay line 23 can be used.

Figure 18:
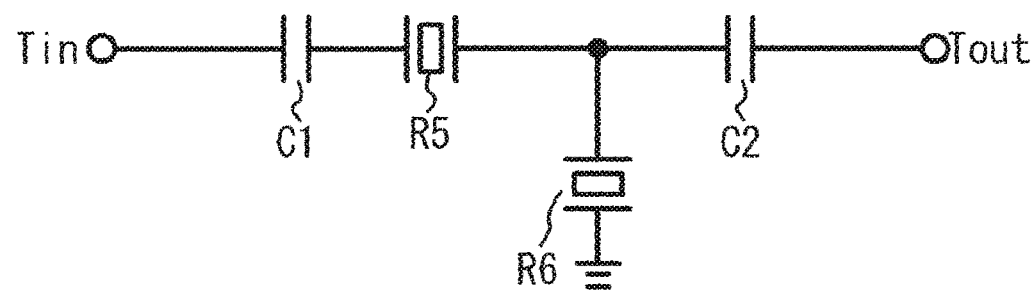
FIG. 18 illustrates another example of the cancel line in the first embodiment.

FIG. 18 illustrates another example of the cancel line in the first embodiment. As illustrated in FIG. 18, instead of the longitudinally coupled resonator, acoustic wave resonators R5 and R6 are provided. The acoustic wave resonator R5 is connected in series between the capacitors C1 and C2, while the acoustic wave resonator R6 is shunt-connected between the capacitors C1 and C2. Instead of the longitudinally coupled resonator and the acoustic wave delay line, a circuit using an acoustic wave resonator such as the one illustrated in FIG. 18 can be used.

As described in the first embodiment and the variations thereof, the cancel line 20 includes an acoustic wave resonator. Thus, a signal that cancels the signal of the main path 52 can be easily generated. The cancel line 20 may not necessarily include an acoustic wave resonator, and may include other elements.

Since the signal intensity of the transmit filter 30 is large, signals easily leak through capacitive coupling. Thus, it is preferable that the reflector located closer to the cancel line 20 in a resonator in the transmit filter 30 is grounded.

Second Embodiment

Figure 19A:
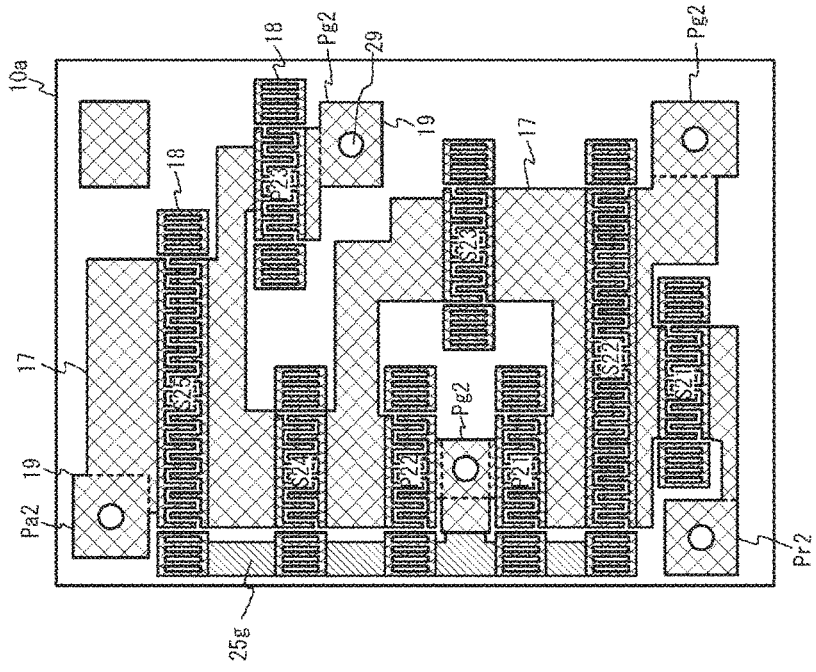
FIG. 19A is a plan view of a piezoelectric substrate on which a transmit filter is formed in a second embodiment.
Figure 19B:
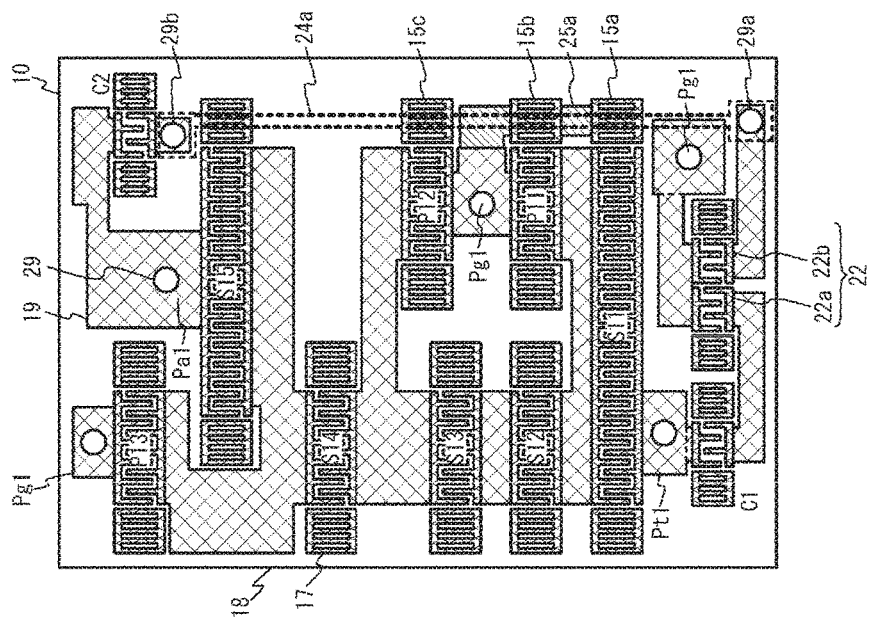
FIG. 19B is a plan view of a piezoelectric substrate on which a receive filter is formed in the second embodiment.

A second embodiment provides a part of the cancel line on a mounting substrate. FIG. 19A is a plan view of a piezoelectric substrate on which a transmit filter is formed in the second embodiment, and FIG. 19B is a plan view of a piezoelectric substrate on which a receive filter is formed in the second embodiment. As illustrated in FIG. 19A, FIG. 19A is the same as FIG. 4 of the first embodiment except that the wiring line 24 is not located on the piezoelectric substrate 10. As illustrated in FIG. 19B, a plurality of acoustic wave resonators 18, the wiring lines 17, and the pads 19 are located on the upper surface of a piezoelectric substrate 10a. The acoustic wave resonators 18 include the series resonators S21 through S24 and the parallel resonators P21 through P23. The wiring lines 17 interconnect the acoustic wave resonators 18. The pads 19 are coupled to the acoustic wave resonators 18. The bumps 29 are located on the pads 19. The pads 19 include a common pad Pa2, a receive pad Pr2, and ground pads Pg2. The common pad Pa2 is electrically coupled to the common terminal Ant. The receive pad Pr1 is electrically coupled to the receive terminal Rx. The ground pad Pg2 is electrically coupled to a ground. The reflectors located closer to the transmit filter of the series resonators S22, S24, and S25 and the parallel resonators P21 and P22 are electrically coupled to the ground pads Pg2 through wiring lines 25g. Other reflectors are floating.

Figure 20:
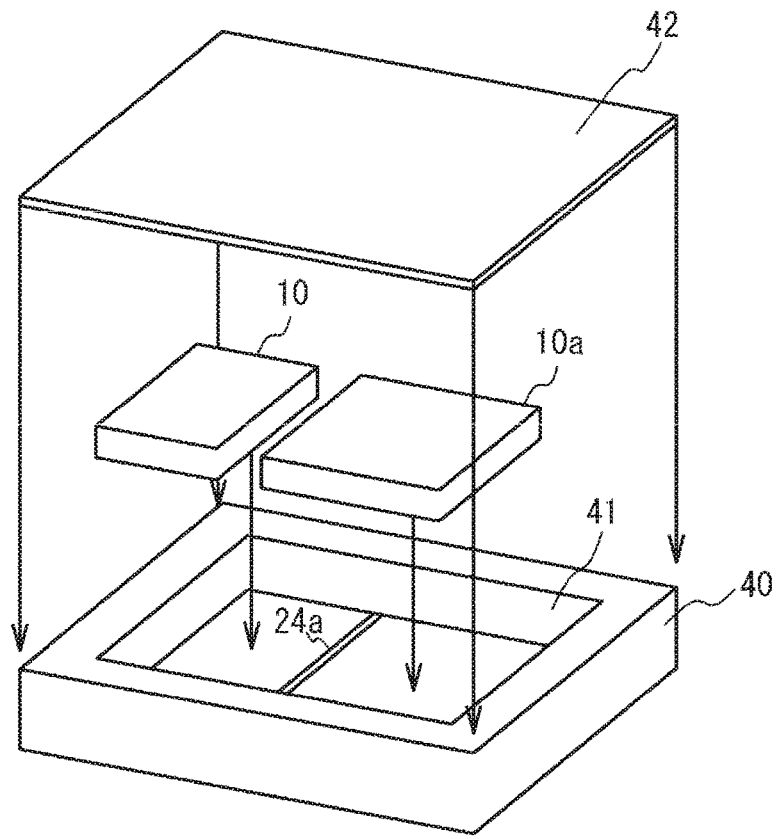
FIG. 20 is an exploded perspective view of a duplexer in accordance with the second embodiment.

FIG. 20 is an exploded perspective view of a duplexer in accordance with the second embodiment. As illustrated in FIG. 20, a cavity 41 is formed in a package substrate 40. A wiring line 24a is formed on the bottom of the cavity 41. The piezoelectric substrates 10 and 10a are flip-chip mounted on the bottom of the cavity 41 by the bumps 29. A lid 42 is fixed on the package substrate 40. Accordingly, the piezoelectric substrates 10 and 10a are sealed in the cavity 41.

As illustrated in FIG. 20, bumps 29a and 29b are coupled to the wiring line 24a formed on the package substrate 40 (a mounting substrate) through the bumps 29a and 29b. Thus, the wiring line 24a does not need to be formed on the piezoelectric substrate 10, and thereby the piezoelectric substrate 10 can be decreased in size.

As illustrated in FIG. 19A, at least a part (the wiring line 24a) of the cancel line 20 is located on the package substrate 40. In the series resonator S11, the reflector located closer to the wiring line 24a of a pair of reflectors is grounded, and the other reflector is not grounded. As illustrated in FIG. 19B, in each of the series resonators S22, S24, and S25, the reflector located closer to the wiring line 24a of a pair of reflectors is grounded, and the other reflector is not grounded. This configuration can inhibit capacitive coupling between the wiring line 24a and the receive filter.

Third Embodiment

Figure 21A:
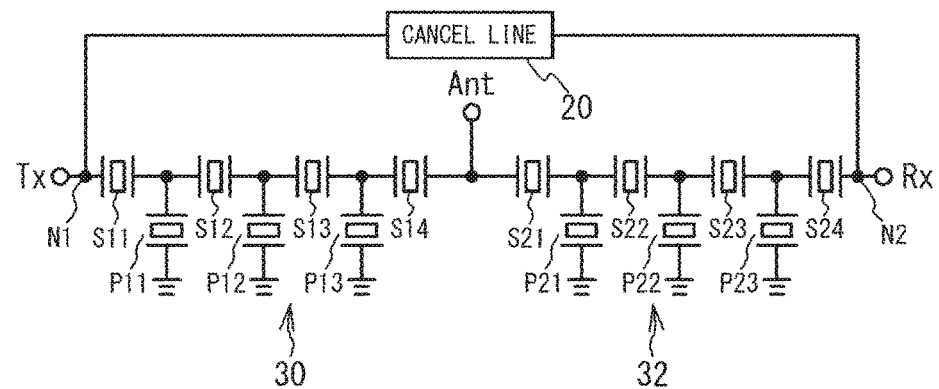
FIG. 21A and FIG. 21B are circuit diagrams of duplexers in accordance with a third embodiment and a first variation thereof, respectively.
Figure 21B:
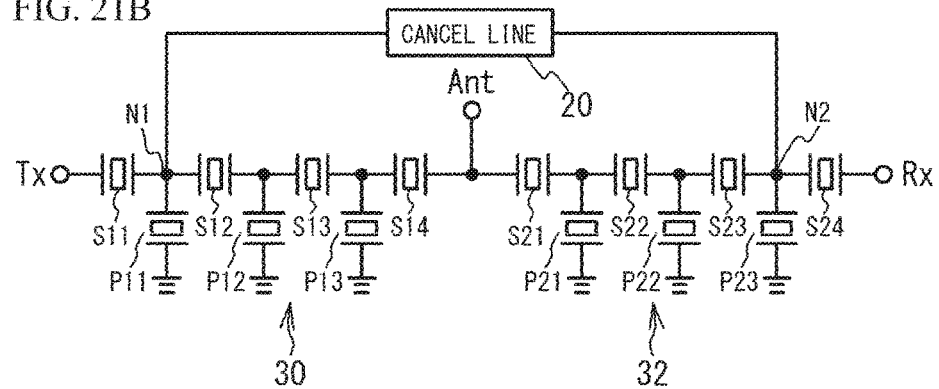

A third embodiment connects a cancel line between a node in a transmit filter and a node in a receive filter. FIG. 21A and FIG. 21B are circuit diagrams of duplexers in accordance with the third embodiment and a first variation thereof, respectively. As illustrated in FIG. 21A, the cancel line 20 is connected between the transmit terminal Tx and the receive terminal Rx. This configuration can reduce signals leaking from the transmit terminal Tx to the receive terminal Rx, and can improve the isolation characteristic. As illustrated in FIG. 21B, the cancel line 20 is connected between the node N1, which is located between the series resonators S11 and S12 of the transmit filter 30, and the node N2, which is located between the series resonators S23 and S24 of the receive filter 32. As described above, it is sufficient if the cancel line 20 is connected in parallel with at least one series resonator. For example, it is sufficient if the cancel line 20 is connected in parallel with at least one series resonator in the transmit filter 30 and at least one series resonator in the receive filter 32.

Figure 22:
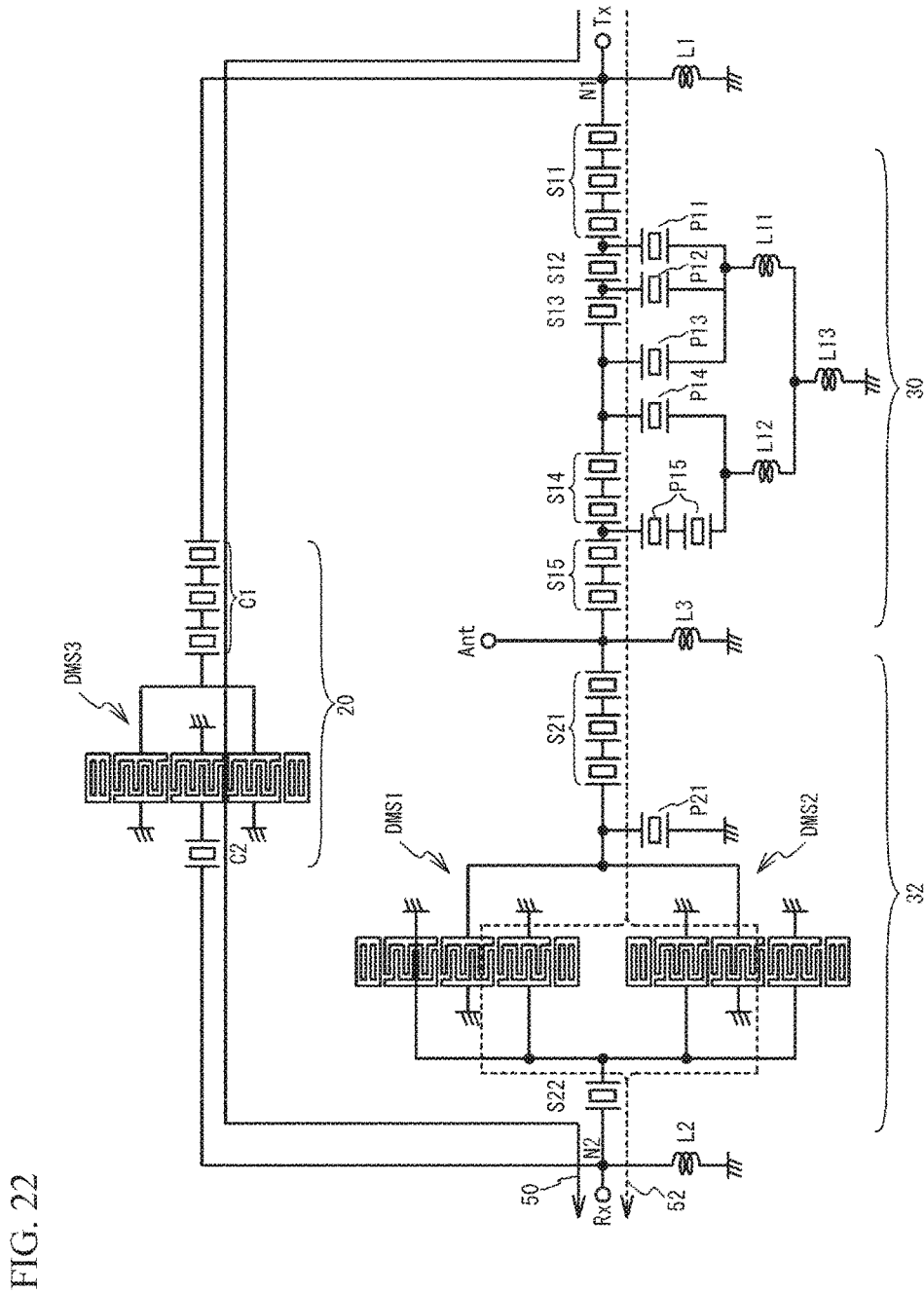
FIG. 22 is a circuit diagram of the duplexer in accordance with the third embodiment.

FIG. 22 is a circuit diagram of a duplexer in accordance with the third embodiment. As illustrated in FIG. 22, in the transmit filter 30, the series resonator S11 is serially divided into three, and each of the series resonators S14 and S15 is serially divided into two. The parallel resonators P11 through P13 are commonly grounded through inductors L11 and L13. A parallel resonator P15 is serially divided into two. The parallel resonators P14 and P15 are commonly grounded through inductors L12 and L13.

In the receive filter 32, the series resonator S21 is serially divided into three. Dual Mode Surface Acoustic Wave (DMS) filters DMS1 and DMS2 are connected in parallel between the parallel resonator P21 and the series resonator S22. The cancel line 20 is connected in parallel with the transmit filter 30 and the receive filter 32 between the nodes N1 and N2. The capacitor C1 is serially divided into three. As a longitudinally coupled resonator, provided is a DMS3. The transmit terminal Tx, the receive terminal Rx, and the common terminal Ant are grounded through matching inductors L1, L2, and L3, respectively. Other structures are the same as those of the first embodiment.

Figure 23:
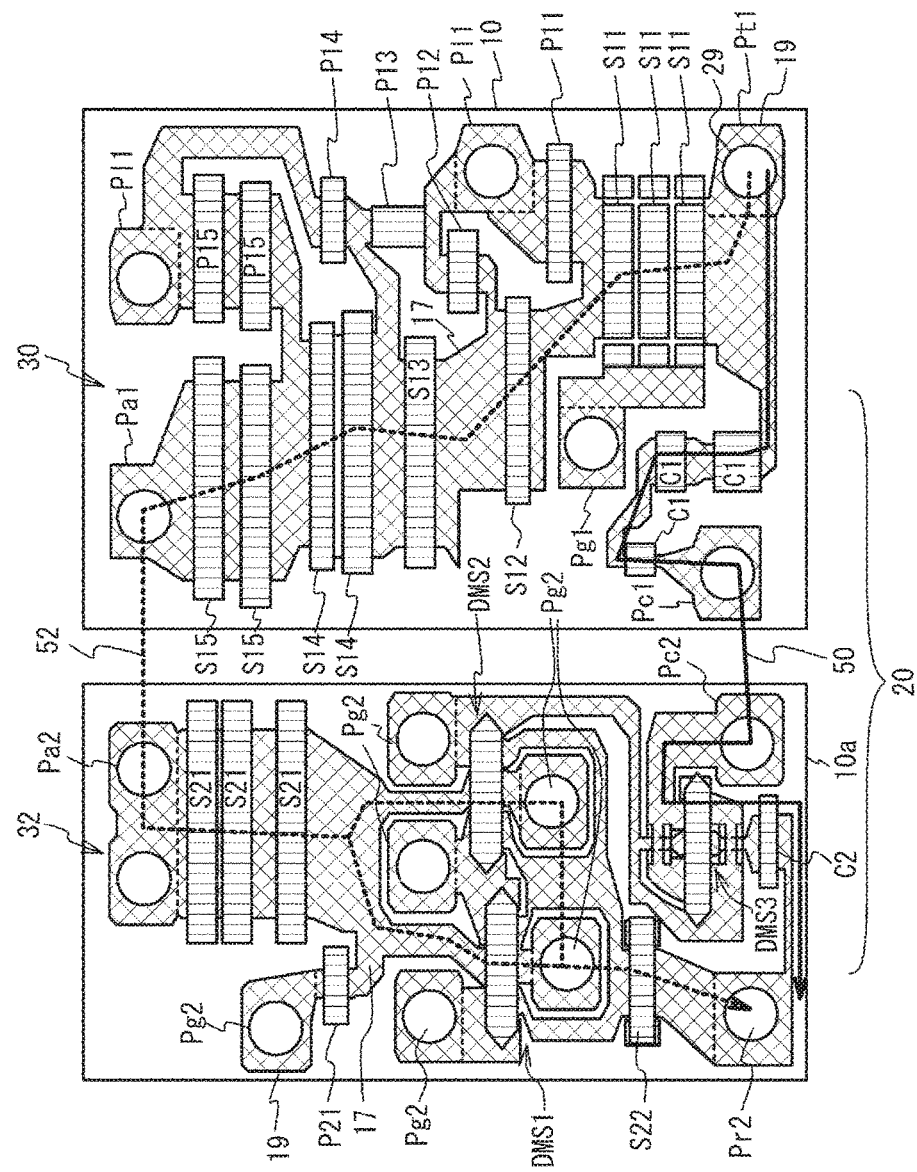
FIG. 23 is a plan view of piezoelectric substrates on which a transmit filter and a receive filter are formed in the third embodiment.

FIG. 23 is a plan view of piezoelectric substrates on which the transmit filter and the receive filter in the third embodiment are formed. As illustrated in FIG. 23, the acoustic wave resonators 18, the wiring lines 17, and the pads 19 are formed on the piezoelectric substrates 10 and 10a. In the transmit filter 30, the pads 19 include the transmit pad Pt1, the common pad Pa1, the ground pads Pg1, a connection pad Pc1, and an inductor pad Pl1. In the receive filter 32, the pads 19 include the receive pad Pr2, the common pad Pa2, the ground pads Pg2, and a connection pad Pc2. The inductor pad Pl1 is coupled to a terminal of a mounting substrate on which the inductors L11 through L13 are located. The connection pads Pc1 and Pc2 are interconnected through the mounting substrate. The common pads Pa1 and Pa2 are coupled to the common terminal Ant, and are interconnected through the mounting substrate.

The capacitor C1 of the cancel line 20 is located on the piezoelectric substrate 10, and the DMS3 and the capacitor C2 are located on the piezoelectric substrate 10a. The DMS3 and the capacitor C1 are interconnected through the mounting substrate. As indicated by the dotted line arrow, the main path 52 passes the series resonators S11 through S15 of the transmit filter 30, the common pads Pa1 and Pa2, and the series resonator S21, the DMS1, the DMS2, and the series resonator S22 of the receive filter 32. The cancel path 50 passes the capacitors C1, the connection pads Pc1 and Pc2, the DMS3, and the capacitor C2.

The reflector 15 located closer to the cancel line 20 of the series resonator S11 is coupled to the ground pad Pg1. Other reflectors are floating. This configuration can inhibit signals in the receive band from leaking from the main path 52 to the cancel path 50 as in the first embodiment. Therefore, the isolation characteristic of the duplexer can be improved.

Figure 24:
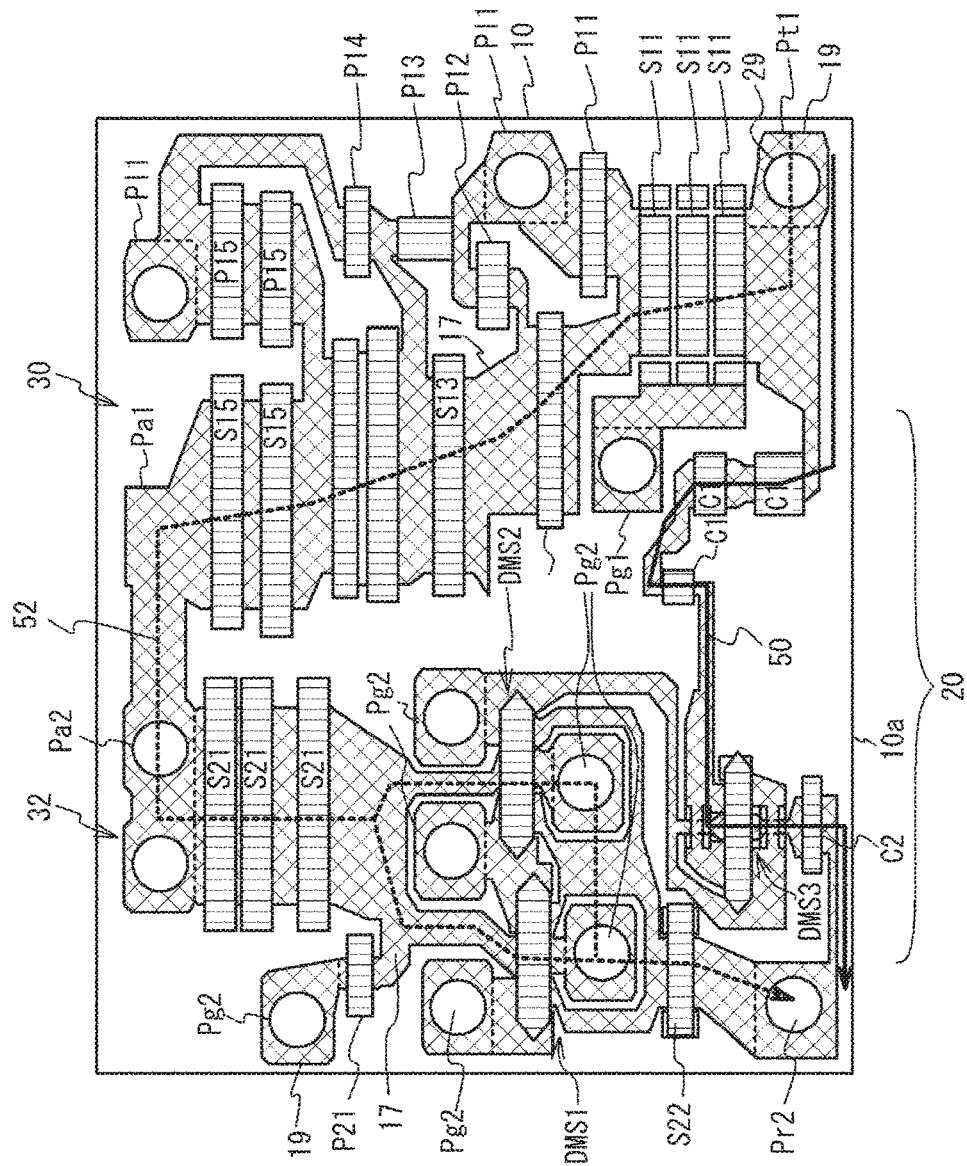
FIG. 24 is a plan view of a piezoelectric substrate on which a transmit filter and a receive filter are formed in a second variation of the third embodiment.

FIG. 24 is a plan view of a piezoelectric substrate on which a transmit filter and a receive filter are formed in a second variation of the third embodiment. As illustrated in FIG. 24, the transmit filter 30, the receive filter 32, and the cancel line 20 may be formed on the same piezoelectric substrate 10.

In the third embodiment and the variations thereof, one or more series resonators S11 through S15 (first series resonators) and one or more parallel resonators P11 through P15 are located on the piezoelectric substrate 10. One or more series resonators S21, DMS1, DMS2, and S22 (second series resonators) and one or more parallel resonators P11 through P15 are located on the piezoelectric substrate 10a. The cancel line 20 is connected between the node N1, which is located between the common terminal Ant and the transmit terminal Tx (a first terminal), and the node N2, which is located between the common terminal Ant and the receive terminal Rx (a second terminal). The reflector of at least one series resonator located between the nodes N1 and N2 is grounded. The cancel line 20 cancels a signal in the passband of the receive filter 32 (outside the passband of the transmit filter 30) propagating through a series resonator located between the nodes N1 and N2.

This configuration can improve the isolation characteristic of the signal in the receive band from the transmit terminal Tx to the receive terminal Rx.

Fourth Embodiment

Figure 25:
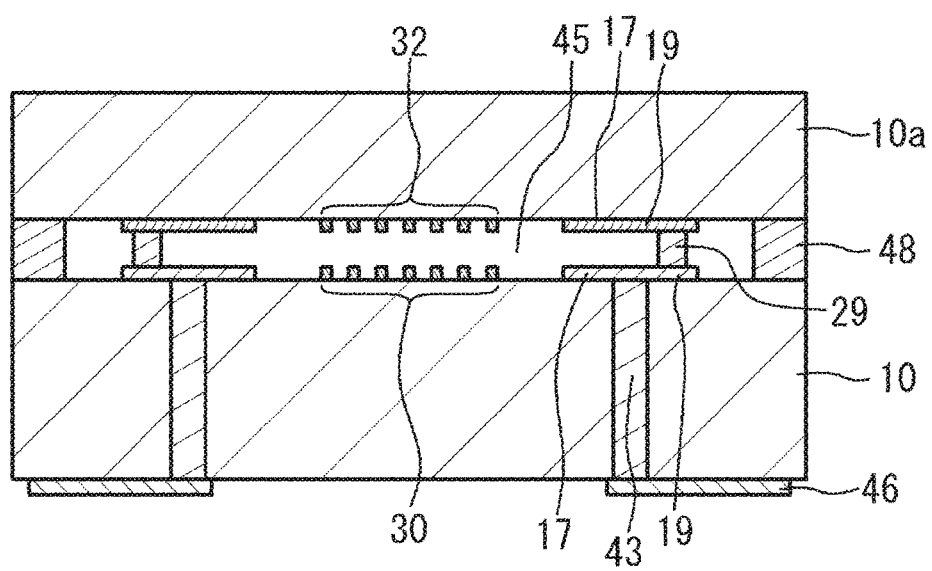
FIG. 25 is a cross-sectional view of a duplexer in accordance with a fourth embodiment.

FIG. 25 is a cross-sectional view of a duplexer in accordance with a fourth embodiment. As illustrated in FIG. 25, the transmit filter 30, the wiring lines 17, and the pads 19 are located on the upper surface of the piezoelectric substrate 10, and terminals 46 are located on the lower surface of the piezoelectric substrate 10. The terminal 46 is, for example, a foot pad. Via wirings 43 penetrating through the piezoelectric substrate 10 are formed. The via wiring 43 electrically connects the terminal 46 to the pad 19. The receive filter 32, the wiring lines 17, and the pads 19 are located on the lower surface of the piezoelectric substrate 10a. The bumps 29 and a ring-shaped sealing portion 48 are located between the piezoelectric substrates 10 and 10a. The bump 29 electrically interconnects the pads 19. The ring-shaped sealing portion 48 is located so as to surround the transmit filter 30 and the receive filter 32, and seals the transmit filter 30 and the receive filter 32 in an air gap 45. The transmit filter 30 and the receive filter 32 face each other across the air gap 45.

The piezoelectric substrates 10 and 10a are, for example, a lithium tantalate substrate or a lithium niobate substrate. The terminals 46, the via wirings 43, and the pads 19 are formed of a metal layer such as, for example, a copper layer, an aluminum layer, or a gold layer. The bump 29 is, for example, a gold bump, a copper bump, or a solder bump. The ring-shaped sealing portion 48 is formed of a metal layer such as a gold layer, a copper layer, or a solder layer, or an insulating layer such as a resin layer.

As described in the fourth embodiment, the transmit filter 30 and the receive filter 32 may face each other across the air gap 45. A part of the cancel line 20 of the transmit filter 30 may be formed on the piezoelectric substrate 10a on which the receive filter 32 is formed.

In the first through fourth embodiments and the variations thereof, the duplexer including the transmit filter 30 and the receive filter 32 has been described as an example, but the duplexer may be a duplexer including transmit filters, or a duplexer including receive filters. Alternatively, the first through fourth embodiments and the variations thereof can be applied to a multiplexer such as a triplexer or a quadplexer in addition to the duplexer.

Although the embodiments of the present invention have been described in detail, it is to be understood that the various change, substitutions, and alterations could be made hereto without departing from the spirit and scope of the invention.

What is claimed is:

1. A filter comprising:
   a piezoelectric substrate;
   one or more series resonators that are located on the piezoelectric substrate and are connected in series between an input terminal and an output terminal;
   at least one series resonator that is connected between a first node and a second node, and is included in the one or more series resonators, the first node and the second node being located between the input terminal and the output terminal; and
   a cancel line that is connected in parallel with the at least one series resonator between the first node and the second node, and cancels a signal outside a passband propagating through the at least one series resonator from the first node to the second node,
   wherein:
   each of the one or more series resonators includes a pair of comb-shaped electrodes not being grounded and a pair of reflectors sandwiching the pair of comb-shaped electrodes in alignment direction of electrode fingers of the pair of comb-shaped electrodes and are adjacent to the pair of comb-shaped electrodes; and
   in each of at least one of the at least one series resonator, one reflector, which is located closer to the cancel line, of the pair of reflectors is grounded and another reflector of the pair of reflectors is not grounded.

2. The filter according to claim 1, wherein
   at least a part of the cancel line is located on the piezoelectric substrate.

3. The filter according to claim 2, wherein
   no resonator and no wiring line are located between the one reflector and the cancel line.

4. The filter according to claim 1, further comprising a substrate on which the piezoelectric substrate is to be mounted.

5. The filter according to claim 1, wherein the one or more series resonators include at least two series resonators connected between the first node and the second node in each of at least two of the at least two series resonators, one reflector, which is located closer to the cancel line, of the pair of reflectors is grounded and another reflector of the pair of reflectors is not grounded.

6. The filter according to claim 1, further comprising:
   one or more parallel resonators connected in parallel between the input terminal and the output terminal; and
   at least one parallel resonator that is connected in parallel between the first node and the second node, and is included in the one or more parallel resonators, wherein:
each of the one or more parallel resonators includes a pair of comb-shaped electrodes not being grounded and a pair of reflectors sandwiching the pair of comb-shaped electrodes in alignment direction of electrode fingers of the pair of comb-shaped electrodes and are adjacent to the pair of comb-shaped electrodes; and
in each of at least one of the at least one parallel resonator, one reflector, which is located closer to the cancel line, of the pair of reflectors is grounded and another reflector of the pair of reflectors is not grounded.

7. The filter according to claim 1, wherein
none of reflectors of a series resonator connected between the input terminal and the first node and a series resonator connected between the output terminal and the second node of the one or more series resonators are grounded.

8. The filter according to claim 1, wherein the cancel line includes an acoustic wave resonator.

9. A multiplexer comprising:
a filter that includes:
a piezoelectric substrate;
one or more series resonators that are located on the piezoelectric substrate and are connected in series between an input terminal and an output terminal;
at least one series resonator that is connected between a first node and a second node, and is included in the one or more series resonators, the first node and the second node being located between the input terminal and the output terminal; and
a cancel line that is connected in parallel with the at least one series resonator between the first node and the second node, and cancels a signal outside a passband propagating through the at least one series resonator from the first node to the second node,
wherein:
each of the one or more series resonators includes a pair of comb-shaped electrodes not being grounded and a pair of reflectors sandwiching the pair of comb-shaped electrodes in alignment direction of electrode fingers of the pair of comb-shaped electrodes and are adjacent to the pair of comb-shaped electrodes; and
in each of at least one of the at least one series resonator, one reflector, which is located closer to the cancel line, of the pair of reflectors is grounded and another reflector of the pair of reflectors is not grounded.

10. The multiplexer according to claim 9, further comprising:
a transmit filter connected between a common terminal and a transmit terminal; and
a receive filter connected between the common terminal and a receive terminal, wherein
the transmit filter includes the filter.

11. A multiplexer comprising:
a first piezoelectric substrate and a second piezoelectric substrate;
a first filter that is located on the first piezoelectric substrate and includes one or more first series resonators connected in series between a common terminal and a first terminal;
a second filter that is located on the second piezoelectric substrate, includes one or more second series resonators connected in series between the common terminal and a second terminal, and has a passband that does not overlap with a passband of the first filter;
at least one series resonator that is connected between a first node, which is located between the common terminal and the first terminal, and a second node, which is located between the common terminal and the second terminal, and is included in the one or more first series resonator and the one or more second series resonator; and
a cancel line that is connected in parallel with the at least one series resonator between the first node and the second node, and cancels a signal outside the passband of one of the first filter and the second filter, the signal propagating through the at least one series resonator,
wherein:
each of the one or more series resonators includes a pair of comb-shaped electrodes not being grounded and a pair of reflectors sandwiching the pair of comb-shaped electrodes in alignment direction of electrode fingers of the pair of comb-shaped electrodes and are adjacent to the pair of comb-shaped electrodes; and
in each of at least one of the at least one series resonator, one reflector, which is located closer to the cancel line, of the pair of reflectors is grounded and another reflector of the pair of reflectors is not grounded.

* * * * *